US008334152B2

(12) United States Patent
Speier

(10) Patent No.: US 8,334,152 B2
(45) Date of Patent: Dec. 18, 2012

(54) METHOD OF MANUFACTURING TRANSFERABLE ELEMENTS INCORPORATING RADIATION ENABLED LIFT OFF FOR ALLOWING TRANSFER FROM HOST SUBSTRATE

(75) Inventor: Ingo Speier, Saanichton (CA)

(73) Assignee: Cooledge Lighting, Inc., British Columbia, CA (US)

( * ) Notice: Subject to any disclaimer, the term of this patent is extended or adjusted under 35 U.S.C. 154(b) by 106 days.

(21) Appl. No.: 12/968,275

(22) Filed: Dec. 14, 2010

(65) Prior Publication Data

US 2011/0151602 A1 Jun. 23, 2011

Related U.S. Application Data

(60) Provisional application No. 61/287,797, filed on Dec. 18, 2009, provisional application No. 61/375,127, filed on Aug. 19, 2010.

(51) Int. Cl.
*H01L 33/00* (2010.01)
(52) U.S. Cl. ............. 438/26; 438/28; 438/36; 438/107; 257/E33.055; 257/E21.06; 257/E21.499
(58) Field of Classification Search ............. 257/E21.06, 257/E21.061, E21.499, E21.502, E33.023, 257/E33.026, E33.028, E33.031, E33.035, 257/E33.055, E33.059, E33.067; 438/22, 438/25, 26, 27, 28, 31, 36, 107, 126, 127, 438/458, 462, 463, 708; 216/65; 264/2.7, 264/104
See application file for complete search history.

(56) References Cited

U.S. PATENT DOCUMENTS

| 6,071,795 | A | 6/2000 | Cheung et al. |
| 6,335,263 | B1 | 1/2002 | Cheung et al. |
| 6,420,242 | B1 | 7/2002 | Cheung et al. |
| 6,448,102 | B1 | 9/2002 | Kneissl et al. |
| 6,455,340 | B1 | 9/2002 | Chua et al. |
| 6,498,113 | B1 | 12/2002 | Solomon et al. |
| 6,559,075 | B1 | 5/2003 | Kelly et al. |
| 6,562,648 | B1 | 5/2003 | Wong et al. |
| 6,617,261 | B2 | 9/2003 | Wong et al. |
| 6,627,921 | B2 | 9/2003 | Wong et al. |
| 6,740,604 | B2 | 5/2004 | Kelly et al. |
| 6,750,121 | B1 | 6/2004 | Kim |
| 6,887,770 | B2 | 5/2005 | Ueda et al. |

(Continued)

FOREIGN PATENT DOCUMENTS

WO WO2007050736 5/2007

(Continued)

OTHER PUBLICATIONS

International Search Report filed in co-pending PCT application No. PCT/CA2010001959 filed on Dec. 16, 2010.

(Continued)

*Primary Examiner* — Hsien Ming Lee
*Assistant Examiner* — Walter H Swanson
(74) *Attorney, Agent, or Firm* — Bingham McCutchen LLP

(57) ABSTRACT

Semiconductor material is formed on a host substrate of a material exhibiting optical transparency with an intervening radiation lift off layer. A transfer device, intermediate substrate or target substrate is brought into adhesive contact with the semiconductor material and the radiation lift off layer is irradiated to weaken it, allowing the semiconductor material to be transferred off the host substrate. Electronic devices may be formed in the semiconductor layer while it is attached to the host substrate or the intermediate substrate.

10 Claims, 18 Drawing Sheets

U.S. PATENT DOCUMENTS

| | | |
|---|---|---|
| 6,923,859 B2 | 8/2005 | Kim |
| 6,932,916 B2 | 8/2005 | Manger et al. |
| 6,974,758 B2 | 12/2005 | Kelly et al. |
| 7,015,055 B2 | 3/2006 | Oohata et al. |
| 7,015,117 B2 | 3/2006 | Urbanek |
| 7,074,631 B2 | 7/2006 | Erchak et al. |
| 7,083,993 B2 | 8/2006 | Erchak et al. |
| 7,169,669 B2 | 1/2007 | Blakers et al. |
| 7,186,580 B2 | 3/2007 | Tran et al. |
| 7,195,944 B2 | 3/2007 | Tran et al. |
| 7,202,141 B2 | 4/2007 | Park et al. |
| 7,208,337 B2 | 4/2007 | Eisert et al. |
| 7,234,214 B2 | 6/2007 | Xu et al. |
| 7,241,667 B2 | 7/2007 | Park et al. |
| 7,244,628 B2 | 7/2007 | Tamura et al. |
| 7,265,389 B2 | 9/2007 | Liu et al. |
| 7,273,798 B2 | 9/2007 | Lester et al. |
| 7,294,521 B2 | 11/2007 | Yoo |
| 7,329,587 B2 | 2/2008 | Bruederl et al. |
| 7,341,925 B2 | 3/2008 | Kelly et al. |
| 7,364,926 B2 | 4/2008 | Yeh et al. |
| 7,368,310 B2 | 5/2008 | Akita |
| 7,371,594 B2 | 5/2008 | Seo et al. |
| 7,371,597 B2 | 5/2008 | Yoo |
| 7,378,334 B2 | 5/2008 | Nagahama et al. |
| 7,384,807 B2 | 6/2008 | Yoo |
| 7,393,705 B1 | 7/2008 | Urbanek |
| 7,399,649 B2 | 7/2008 | Miyachi et al. |
| 7,410,882 B2 | 8/2008 | Wong et al. |
| 7,432,119 B2 | 10/2008 | Doan |
| 7,435,606 B2 | 10/2008 | Lee et al. |
| 7,442,565 B2 | 10/2008 | Ryu et al. |
| 7,442,569 B2 | 10/2008 | Lee et al. |
| 7,452,739 B2 | 11/2008 | Chu et al. |
| 7,465,592 B2 | 12/2008 | Yoo |
| 7,485,482 B2 | 2/2009 | Lee et al. |
| 7,494,896 B2 | 2/2009 | Gupta |
| 7,524,692 B2 | 4/2009 | Park et al. |
| 7,528,681 B2 | 5/2009 | Knollenberg et al. |
| 7,541,262 B2 | 6/2009 | Ando et al. |
| 7,553,682 B2 | 6/2009 | Baik et al. |
| 7,557,367 B2 | 7/2009 | Rogers et al. |
| 7,579,259 B2 | 8/2009 | Fournel et al. |
| 7,588,952 B2 | 9/2009 | Lee et al. |
| 7,588,998 B2 | 9/2009 | Fehrer et al. |
| 7,608,471 B2 | 10/2009 | Bahl |
| 7,683,380 B2 | 3/2010 | Lee et al. |
| 7,687,810 B2 | 3/2010 | Mo et al. |
| 7,691,656 B2 | 4/2010 | Bader et al. |
| 7,695,989 B2 | 4/2010 | Baik et al. |
| 7,776,637 B2 | 8/2010 | Leem |
| 7,781,246 B2 | 8/2010 | Kim et al. |
| 7,781,247 B2 | 8/2010 | Tran |
| 7,846,847 B2 | 12/2010 | Park et al. |
| 8,008,098 B2 * | 8/2011 | Jeong ............................. 438/22 |
| 2005/0227455 A1 | 10/2005 | Park et al. |
| 2005/0247950 A1 | 11/2005 | Nakamura et al. |
| 2006/0003553 A1 | 1/2006 | Park et al. |
| 2006/0006398 A1 | 1/2006 | Hata |
| 2006/0097270 A1 | 5/2006 | Yuri |
| 2006/0097274 A1 | 5/2006 | Lee et al. |
| 2006/0124939 A1 | 6/2006 | Lee et al. |
| 2006/0148186 A1 | 7/2006 | Lee et al. |
| 2006/0189098 A1 | 8/2006 | Edmond |
| 2006/0268955 A1 | 11/2006 | Cho et al. |
| 2007/0032089 A1 | 2/2007 | Nuzzo et al. |
| 2007/0077673 A1 | 4/2007 | Hwang et al. |
| 2007/0082486 A1 | 4/2007 | Yang et al. |
| 2007/0126022 A1 | 6/2007 | Baik et al. |
| 2007/0155032 A1 | 7/2007 | Kim et al. |
| 2007/0164298 A1 | 7/2007 | Kim et al. |
| 2008/0048206 A1 | 2/2008 | Lee et al. |
| 2008/0049802 A1 | 2/2008 | Kim et al. |
| 2008/0054291 A1 | 3/2008 | Kim et al. |
| 2008/0093611 A1 | 4/2008 | Hahn et al. |
| 2008/0108171 A1 | 5/2008 | Rogers et al. |
| 2008/0113460 A1 | 5/2008 | Shelton et al. |
| 2008/0113483 A1 | 5/2008 | Wells |
| 2008/0241982 A1 | 10/2008 | Lee et al. |
| 2008/0261341 A1 | 10/2008 | Zimmerman et al. |
| 2008/0272382 A1 | 11/2008 | Kim et al. |
| 2008/0274575 A1 | 11/2008 | Shin et al. |
| 2008/0283869 A1 | 11/2008 | Noh et al. |
| 2009/0101929 A1 | 4/2009 | Mo et al. |
| 2009/0137075 A1 | 5/2009 | Yang et al. |
| 2009/0181485 A1 | 7/2009 | Baik et al. |
| 2009/0224283 A1 | 9/2009 | Huang et al. |
| 2009/0267083 A1 | 10/2009 | Cui |
| 2010/0193913 A1 | 8/2010 | Kusuura |

FOREIGN PATENT DOCUMENTS

| | | |
|---|---|---|
| WO | WO2008114990 | 9/2008 |
| WO | WO2009026366 | 2/2009 |
| WO | WO2009035218 | 3/2009 |
| WO | 2010132552 | 11/2010 |

OTHER PUBLICATIONS

Liang, X. 2005. "Electrostatic Force-Assisted Nanoimprint Lithography (EFAN)," Nano Lett. 5(3):527-530.

* cited by examiner

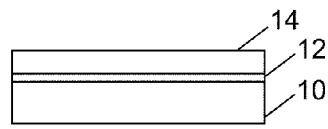
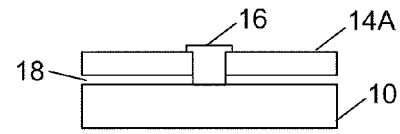
Fig 1A, Prior Art    Fig 1B, Prior Art
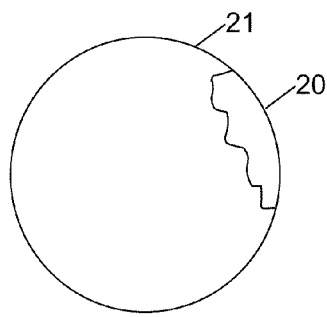
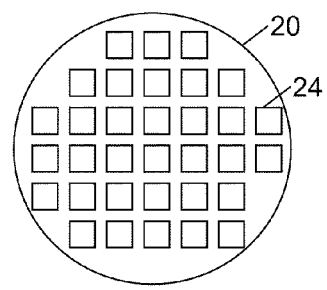
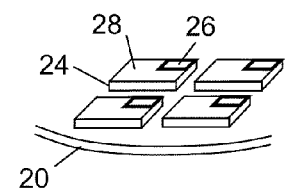
Fig 2A    Fig 2B    Fig 2C
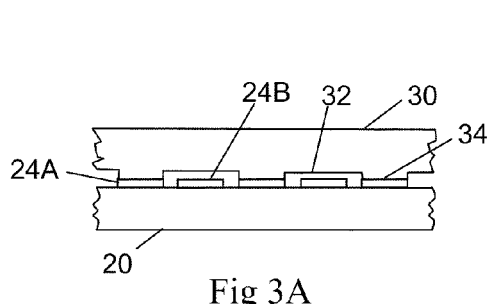
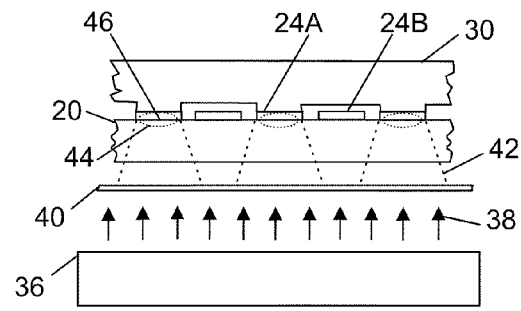
Fig 3A    Fig 3B

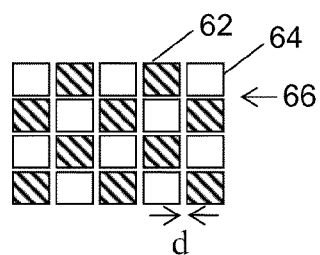
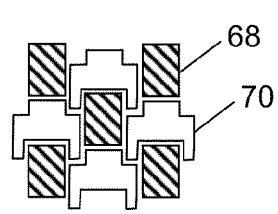
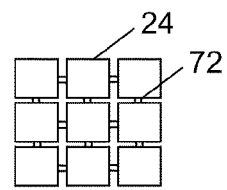
Fig 5A      Fig 5B      Fig 5C
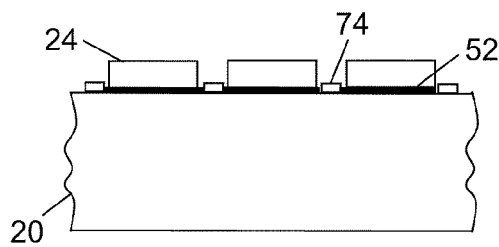
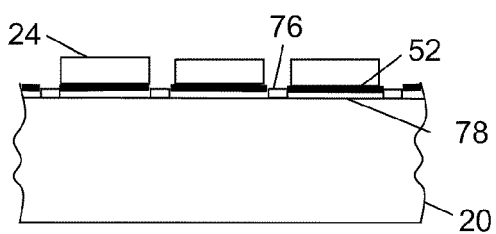
Fig 5D      Fig 5E
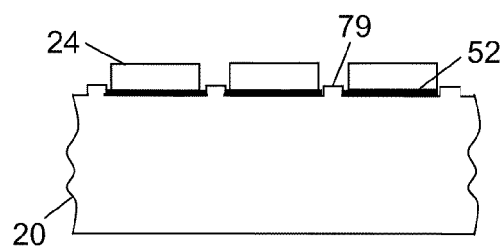
Fig 5F

METHOD OF MANUFACTURING TRANSFERABLE ELEMENTS INCORPORATING RADIATION ENABLED LIFT OFF FOR ALLOWING TRANSFER FROM HOST SUBSTRATE

This patent application claims the benefit of U.S. provisional application Nos. 61/287,797 and 61/375,127, respectively filed Dec. 18, 2009 and Aug. 19, 2010. The disclosures of said provisional applications are hereby incorporated herein by reference thereto.

TECHNICAL FIELD

The subject matter of the present invention is directed generally to the manufacture of transferable elements and, more particularly, is concerned with a method of manufacturing transferable elements incorporating radiation enabled lift off for allowing transfer from a host substrate.

BACKGROUND ART

Illumination based on semiconductor light sources, such as light-emitting diodes (LEDs), offers an efficient and long-lived alternative to fluorescent, high-intensity discharge and traditional incandescent lamps. Many LED light sources employ high powered LEDs, which pose thermal management problems and other related problems. Another drawback with state of the art LED devices is a high initial cost.

Currently, gallium nitride (GaN) based LEDs are epitaxially grown on sapphire substrates. These substrates have disadvantages such as high cost, low thermal conductivity at temperatures of interest and they are electrical insulators. Another problem with sapphire as a substrate is its chemical inertness, which makes it difficult to release epitaxially grown material using a chemical etching process.

In an ideal situation, LEDs would be grown on cheap, thermally and electrically conductive substrates, such as silicon. However, growing GaN material on a silicon substrate provides significant challenges due to the significant lattice mismatch between silicon and GaN as well as too high a difference between the coefficients of thermal expansion of the two materials. This results in high defect densities of the materials grown as well as poor performance. There are several approaches common in the industry to mitigate the problems. In one approach complex buffer layers are grown to compensate for thermal and lattice mismatch between the substrate and the epitaxial layer. In a different solution an epitaxial lateral-overgrowth (ELOG) process is chosen. In yet a different solution the epitaxial layer is grown on islands considerably smaller than the entire wafer.

There are certain advantages of using micro-LEDs in lighting devices. Currently, the only feasible process to transfer semiconductor die including micro-LEDs is to use an elastomeric stamping process. In order to allow for such a stamping transfer process, the semiconductor material needs to be specially prepared and processed. Firstly, a sacrificial layer is required on the substrate or in the epitaxial stack to allow for the release of the semiconductor die. Secondly, the epitaxial layer needs to be specially processed to provide anchoring for the semiconductor die during and after the release process. Thirdly, the sacrificial layer is removed (e.g. through a wet etching process), leaving an array of semiconductor die suspended above the substrate ready for the transfer process to take place. FIG. 1A shows a prior art process in which an epitaxial layer 14 is grown above a sacrificial layer 12 on a substrate 10. Referring to FIG. 1B, after preparation of an anchor structure 16 etching of the sacrificial layer 12 leaves a gap 18 between substrate 10 and suspended semiconductor die 14A formed from the epitaxial layer 14.

Another process is to transfer epitaxially grown material from a sapphire substrate to a silicon substrate via wafer bonding and subsequent removal of the sapphire using laser lift off. The silicon still needs to be prepared for release etching of the functional epitaxial material. This process, however, introduces additional process steps and further expense.

There is still, therefore, a need for an alternative method of manufacturing transferable semiconductor die which is less complex and costly.

SUMMARY OF THE INVENTION

The present invention is directed to methods of manufacturing transferable elements, such as semiconductor die, that incorporates any one of several radiation enabled lift off techniques that allows the transfer of semiconductor die, from a host substrate with or without the need for anchoring structures and an intermediate substrate. Use of a silicon wafer as a host substrate is avoided. The host substrate is substantially optically transparent to selected radiation, for example of a laser, while the epitaxial material itself, or a sacrificial layer deposited at the interface between the host substrate and epitaxial layer, exhibits substantially absorptive properties. Application of laser radiation results in decomposition and/or weakening of the interfacial layer or sacrificial layer and release of semiconductor material or individual semiconductor die from the host substrate. For example, semiconductor die made of GaN materials such as blue or green micro-LEDs are grown on a host substrate made of sapphire. Making use of the optical transparency of sapphire and the absorptive properties of GaN material to UV light the semiconductor die can be individually lifted off the host substrate by decomposition of the interfacial layer with the help of laser radiation. The individual micro-LEDs that are released from the host substrate can either be transferred directly to a target substrate or to a transfer device such as a composite stamp.

Avoidance of the need for anchoring structures as well as the need for an intermediate substrate reduces cost and complexity of the transfer process. However, alternatively, selective polymerization of an adhesive layer may be used such that more cured portions of the adhesive layer form part of anchor structures that hold the semiconductor die to an intermediate substrate. Another alternative is use of an adhesive layer that can be selectively irradiated in order to reduce its adhesive force, allowing semiconductor die over the weakened adhesive to be easily transferred from an intermediate substrate. Yet another alternative is use of ferromagnetic layers on both the semiconductor die and an intermediate substrate to temporarily bind the semiconductor die to the intermediate substrate. A further alternative is use of an intermediate substrate having mesas with which semiconductor die formed in the semiconductor layer can be aligned.

Therefore, in one aspect of the present invention, a method of manufacturing a transferable element includes the steps of providing a host substrate of a material exhibiting optical transparency, forming an epitaxial layer on the host substrate including a layer allowing for radiation lift off, defining one or more semiconductor die in the epitaxial layer, adhering a transfer device to one or more of the semiconductor die, irradiating the radiation lift off layer to weaken the layer, and moving the transfer device and the substrate apart, thereby transferring the one or more semiconductor die from the host substrate to the transfer device.

In another aspect of the present invention, a method of manufacturing a transferable element includes the steps of providing a host substrate of a material exhibiting optical transparency, forming an epitaxial layer on the host substrate including a layer allowing for radiation lift off, defining one or more semiconductor die in the epitaxial layer, adhering a target substrate to one or more of the semiconductor die, irradiating the radiation lift off layer to weaken the layer, and moving the host substrate and the target substrate apart, thereby transferring the one or more semiconductor die from the host substrate to the target substrate.

In a further aspect of the present invention, a method of manufacturing a transferable element includes the steps of providing a host substrate of a material exhibiting optical transparency, forming an epitaxial layer on the host substrate including a layer allowing for radiation lift off, adhering an intermediate substrate to the epitaxial layer using selectively polymerized and unpolymerized adhesive, irradiating the radiation lift off layer to weaken the layer, removing the host substrate, defining one or more semiconductor die in the epitaxial layer, removing unpolymerized adhesive, adhering a transfer device to one or more of the semiconductor die, and moving the transfer device and the intermediate substrate apart, thereby transferring the one or more semiconductor die from the intermediate substrate to the transfer device.

BRIEF DESCRIPTION OF THE DRAWINGS

For clarity, the drawings herein are not necessarily to scale, and have been provided as such in order to illustrate the principles of the subject matter, not to limit the invention.

FIG. 1A is a schematic view of a prior art substrate with sacrificial and epitaxial layers.

FIG. 1B is a schematic view of a prior art semiconductor die suspended after sacrificial layer etching.

FIG. 2A is a schematic top view of a host substrate employed in a method of manufacturing transferable semiconductor die in accordance with the present invention.

FIG. 2B is a schematic top view of the host substrate with defined epitaxial semiconductor die.

FIG. 2C is an enlarged isometric schematic view of a portion of the host substrate of FIG. 2B with semiconductor die having p and n contacts.

FIG. 3A is a schematic view of a portion of a stamp brought into contact with certain semiconductor die on the host substrate.

FIG. 3B schematically illustrates laser radiation incident at the interface between certain semiconductor die and the host substrate.

FIG. 5A is a schematic view of an arrangement of semiconductor die of which some are on melted gallium layer and others on solid gallium layer.

FIG. 5B is a schematic view of an alternate arrangement of semiconductor die of which some are selected for a stamp transfer step.

FIG. 5C is a schematic view of an arrangement of semiconductor die between which are breakable bridges.

FIG. 5D is a schematic view of a semiconductor die with intervening spacers.

FIG. 5E is a schematic view of a semiconductor die on a surface with different wettabilities.

FIG. 5F is a schematic view of a semiconductor die on a surface with patterned ridges.

DESCRIPTION OF EMBODIMENTS

Figure 4A:
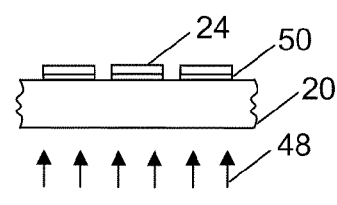
FIG. 4A schematically illustrates laser radiation of the host substrate having semiconductor die and an intervening GaN layer.
Figure 4B:
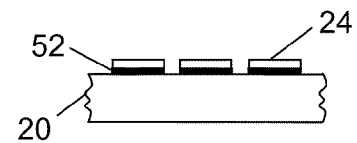
FIG. 4B is a schematic view of a gallium layer between the host substrate and semiconductor die.

The term semiconductor die includes light-emitting elements, which is any device that emits electromagnetic radiation within a wavelength regime of interest, for example, visible, infrared or ultraviolet regime, when activated, by applying a potential difference across the device or passing a current through the device. Examples of light-emitting elements include solid-state, organic, polymer, phosphor coated or high-flux light-emitting diodes (LEDs), micro-LEDs, laser diodes or other similar devices as would be readily understood. Without limiting the foregoing, micro-LEDs include LEDs with semiconductor die with lateral dimension 300 micron or smaller. The output radiation of an LED may be visible, such as red, blue or green, or invisible, such as infrared or ultraviolet. An LED may produce radiation of a spread of wavelengths. An LED may comprise a phosphor for converting part of its output from one wavelength to another. An LED may comprise multiple LEDs, each emitting essentially the same or different wavelengths.

While LEDs have been used as examples of transferable elements that can be made by the method of the present invention, other devices can also be made, for example, integrated circuits, photovoltaic cells (for example single junction or multijunction cells for concentrator photovoltaic applications), transistors, photodiodes, laser diodes, resistors, capacitors, non emitting diodes. Semiconductor die made by the method of the present invention may be used in electronic devices or in modules that can be incorporated in electronic devices. For example, a luminaire may comprise semiconductor die made by the method of the disclosed subject matter.

The following is a description of a plurality of exemplary embodiments of the method of the present invention for manufacturing transferable elements incorporating various radiation enabled lift off techniques. The radiation enabled lift off techniques take advantage of the substantial optical transparency of the host substrate to radiation compared to the selective absorption of radiation by the epitaxial layer itself or a sacrificial layer deposited at the interface between host substrate and epitaxial layer. The radiation penetrates the substantially transparent host substrate and is absorbed at the sacrificial or interfacial layer causing it to decompose, weaken or be destroyed.

For example, transferable elements in the form of semiconductor die providing LEDs of blue or green chromaticity utilize GaN based material epitaxially grown on host substrates made of sapphire. A suitable source, such as a laser, that provides radiation in the form of a UV light at a wavelength of 248 nm or 355 nm, with a pulsed energy density typically in the range 100-600 mJ cm$^{-2}$, can be used to enable release of the semiconductor die formed by the epitaxial layer from the host substrate, although other wavelengths and energy densities are possible. The UV radiation penetrates the host substrate of sapphire, which is substantially transparent to the radiation, and is absorbed by the GaN at the interface causing the interfacial layer to decompose, weaken or be destroyed, releasing the epitaxial semiconductor die. Localized temperatures in the region of 1000° C. can be reached during decomposition, after which the epitaxial semiconductor die can be easily released.

First Exemplary Embodiment of Method—Single Step Radiation Lift Off to Stamp

Referring to FIG. 2A, in the first exemplary embodiment of the manufacturing method a host substrate 20 is provided. The host substrate 20 is formed of a material, such as sapphire or the like, exhibiting substantial optical transparency to radiation, such as UV light, as described above. An epitaxial layer 21, which may include one or more layers, is grown on the host substrate 20 and processed and formed, for example, by using the well-known patterning and etching techniques, into semiconductor die 24 disposed on the host substrate 20 as shown in FIG. 2B. While square semiconductor die 24 have been shown, other shapes are possible, including rectangular, hexagonal, circular, polygonal, regular, irregular, compound or slotted. FIG. 2C depicts a partial view of the host substrate 20 with semiconductor die 24 that have each been metalized with n contact areas 26 and p contact areas 28. In one example the semiconductor die may have a linear dimension of approximately 100 µm, in another example they could have any value included within the range of approximately 25 µm to 300 µm, and in yet another example, they could have a value outside this range. The vertical etching step that defines the mesa of the semiconductor die 24 typically penetrates the entire GaN epitaxial stack, terminating at the host substrate 20.

Due to the difference in coefficient of thermal expansion between the epitaxial GaN/InGaN/GaN layer and the sapphire substrate over the range of temperatures from the deposition temperature at roughly 1300 K and roughly room temperature of 250 K, there is a biaxial in-plane strain of approximately 1.2×10$^{-3}$ Δm/m (units is change in length per unit length). This strain leads to a number of electro-optical effects including wavelength shifts with increasing forward drive voltage and current. There is therefore a particular advantage in etching and metalizing semiconductor die 24 while epitaxy layer 21 is still on host substrate 20 in that the strain on the die is relieved prior to transfer to another substrate.

FIG. 3A shows a stamp 30 that has been aligned and brought into contact with certain of the semiconductor die 24A that have been formed on host substrate 20. The stamp 30 may be a composite elastomeric stamp. In this example, other semiconductor die 24B are not brought into contact with the stamp 30 because surfaces 32 in the stamp 30 are recessed compared to the level of the surfaces 34. When using this stamp 30, the surfaces 34 may adhere to the semiconductor die 24A via van der Waals forces. In another embodiment surfaces 32 are flush with surfaces 34 but are made with a different material or have been treated such that they won't form a bond with surfaces 34. Examples of treatments for the surfaces 32 include chemical, exposure to UV radiation or exposure to electron beams. Alternatively, the surfaces 32 and 34 may be flush but only surfaces 34 are treated. Alternatively still, both surfaces 32 and 34 may be treated differently.

In an alternate approach, semiconductor die 24 are coated with a ferromagnetic or paramagnetic layer, such as for example nickel or cobalt thin films or ferrite compounds in an organic binder. In one example, Nd$_2$Fe$_{14}$B (ferrite) particles are embedded in a photoresist such as SU-8 that is spin-coated as a thick film (not shown) on host substrate 20 with semiconductor die 24 and then exposed and wet etched to remove the photoresist between semiconductor die 24. Stamp 30 is similarly spin coated and etched to leave a thick film on surfaces 34. Magnetizing the magnetic layers thereby provides a binding force between semiconductor die 24A and surfaces 34 when they are brought into physical contact.

When the stamp surfaces 34 have adhered to the semiconductor die 24A, the interface 46 between the semiconductor die 24A and the host substrate 20 is irradiated with energy, as shown in FIG. 3B. Here, a source 36 of laser irradiation 38 is directed towards an optical system 40, which may be a mesh, a grid, a template, a lens array or a combination thereof. After passing through the optical system 40, the laser irradiation 38 is focused, as shown at 42, into zones 44 at or in the vicinity of the interfaces 46 between the semiconductor die 24A and the host substrate 20. The irradiation 38, after passing through the substantially optically transparent host substrate 20, will decompose, weaken or destroy the material at the host substrate semiconductor die interface.

As an example, a KrF excimer laser may be used to provide the laser irradiation 38 at a wavelength of 248 nm and pulse energy density of 100-600 mJ cm$^{-2}$. As another example, an Nd:YAG laser may be used, where its output is used in the third harmonic at a wavelength of 355 nm or its fourth harmonic of 266 nm. One skilled in the art will realize that other lasers may be used to achieve the same result.

The optical system 40 may be designed such that the laser 36 irradiates one semiconductor die-host substrate interface 46 at a time, or several semiconductor die-host substrate interfaces 46 at the same time. It may be possible to scan the laser 36 and/or optical system 40 over all the interfaces 46 to be irradiated. In one embodiment, optical system 40 is an optically opaque mask with openings for the interfaces 46 to be exposed.

After the semiconductor die to host substrate interfaces 46 have been irradiated, the semiconductor die 24A can be readily released from the host substrate 20 by moving the stamp 30 away from the host substrate 20, or moving the host substrate 20 away from the stamp 30. The van der Waals forces between the semiconductor die 24A and the stamp 30 are strong enough to remove the semiconductor die 24A from the host substrate 20. As the stamp 30 is separated from the host substrate 20, the other semiconductor die 24B are left behind on the host substrate 20. The stamp 30 may then transfer the released semiconductor die 24A to a recipient or target substrate (not shown).

In yet a different embodiment temperatures in the semiconductor die achieved in the laser radiation propagate to the semiconductor die stamp interface and are sufficient to melt wax disposed on the stamp. The wax will form a bond between the semiconductor die and the stamp sufficient to transfer semiconductor die of the host substrate.

In yet a different embodiment temperatures in the semiconductor die achieved in the laser radiation propagate to the semiconductor die stamp interface and are sufficient to cure an adhesive disposed on the stamp. The adhesive will form a bond between the semiconductor die and the stamp sufficient to transfer semiconductor die of the host substrate.

In yet a different embodiment temperatures in the semiconductor die achieved in the laser radiation propagate to the semiconductor die stamp interface, causing a phase change in material disposed on the stamp and promoting a bond between stamp and semiconductor die. Alternatively the bonding through temperature-activated processes may be achieved through microwave radiation and disposition of a microwave absorptive layer in the stamp or in the semiconductor die. For example, the microwave absorptive layer may be made up of waxes, resins or polymers.

Second Exemplary Embodiment of Method—Two Step Laser Radiation Lift Off

In a second exemplary embodiment of the manufacturing method it is possible to decompose the GaN layer during the irradiation step while not releasing the semiconductor die 24A from the host substrate 20. In this embodiment irradiation of the interface layer decomposes the GaN into N$_2$ gas and metallic Ga. The metallic gallium present in the interface layer continues to bind the semiconductor die 24A to the host substrate 20. In a second step subsequent application of a temperature sufficient to melt the gallium layer will then allow for the release of the semiconductor die. Due to the relatively low melting point of gallium, this temperature could be in the region of 30° C.

FIGS. 4A-4D illustrate this two step laser lift off technique employed in the second exemplary embodiment of the method of the present invention. Initially, the host substrate 20, made of optically transparent material, such as sapphire, is prepared with an epitaxial layer and defined with semiconductor die 24 according to FIG. 2C described above. The epitaxial layer is etched down to the host substrate 20. After this, a laser, such as a KrF excimer laser operating at a wavelength of 248 nm and pulse energy density of 100-600 mJ cm$^{-2}$, is used to provide radiation 48 to the host substrate 20, as shown in FIG. 4A. Also shown in FIG. 4A is a GaN layer 50 under the semiconductor die 24. The laser energy 48 can be directed to a whole substrate, part of a substrate, areas where there are specific semiconductor die, or to one semiconductor die at a time. As in the previously described process, an optical system 40 may also be used to facilitate the direction of laser irradiation to the desired interfaces. The duration and intensity of the laser irradiation is chosen to decompose the interfacial GaN layer 50, into Ga and N$_2$, leaving a metallic gallium layer 52 in FIG. 4B that holds the semiconductor die 24 in place.

Figure 4C:
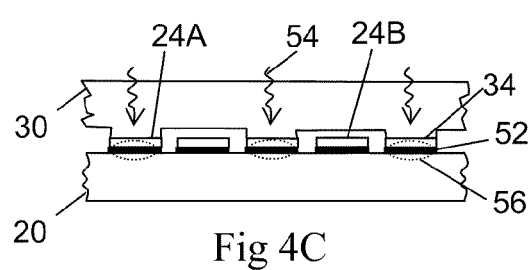
FIG. 4C is a schematic view of a stamp in contact with certain semiconductor die and schematically illustrates heating of corresponding regions of the gallium layer.
Figure 4D:
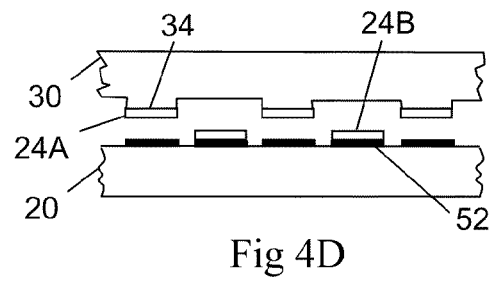
FIG. 4D schematically illustrates stamp lift off of semiconductor die from where the gallium layer on the host substrate has been heated.

Once the GaN layer 50 has been decomposed to result in a metallic layer 52 the surfaces 34 of a stamp 30 can be aligned and brought into contact with some of the semiconductor die 24A as shown in FIG. 4C. Others of the semiconductor die 24B are not contacted with the stamp 30. Heat 54 is applied to localized areas 56 of the assembly at or in the vicinity of the semiconductor die-to-host substrate interface that comprises metallic gallium 52. Heat may be applied by infra red radiation through the stamp, via conduction through the stamp, via radio-frequency induction, or via infra-red laser or other infra red radiation through the stamp or through the host substrate or microwave radiation or other means. The result of the heat 54 in zones 56 is to cause the gallium layer 52 to melt, allowing for the release of the semiconductor die 24A from the host substrate 20. In the case that heat is propagating through the stamp 30, which is not in contact with the other semiconductor die 24B, there is less heat transferred to the gallium layer beneath the semiconductor die 24B not in contact with the stamp 30 and the gallium is not melted in this location. In a different embodiment the gallium layer beneath the semiconductor die 24 B is also melted, but the semiconductor die are not released as no bond is formed between the stamp and semiconductor die in these locations. The stamp 30 is subsequently separated from the substrate 20, as shown in FIG. 4D. The adhesive forces between surfaces 34 of the stamp 30 and the semiconductor die 24A are sufficient to remove the semiconductor die 24A from the host substrate 20 and transfer them to another, receiving substrate (not shown). The other semiconductor die 24B that were not contacted with the stamp will remain on the substrate 20, bonded to the gallium 52.

Third Exemplary Embodiment of Method—Maintaining Semiconductor Die Location

In a third exemplary embodiment of the manufacturing method of the present invention, which is a variation of the above-described two step process, the entire wafer may be heated to a sufficient temperature to allow for reflow of the gallium layer 52. The stamp 30 may be configured to pick up semiconductor die 24A, as described above; but in order to control the position of the semiconductor die, several solutions are described hereinafter, with reference to FIGS. 5A-5F.

In FIG. 5A, a variation is shown where an optical system is used with the laser such that every second semiconductor die 62 is irradiated. Even if only some of these semiconductor die 62 are to be transferred to a stamp, or other substrate, the ones that are not picked up are restrained in sideways movement by the adjacent semiconductor die 64 that are still on a layer of solid gallium. The width d of the trenches 66 between the semiconductor die 62, 64 can be minimized in order to restrict sideways movement as much as possible. In a different embodiment the trenches 66 can be filled with a material such as photoresist that will not bond to the semiconductor die but maintain its phase while melting the gallium.

In FIG. 5B another arrangement is shown in which the whole wafer can be heated to melt the gallium layer. A first set of semiconductor die 68 can be removed, while allowing the other semiconductor die 70 to remain interlocked and hence restricted in sideways movement. The other semiconductor die 70 can then be transferred in a subsequent step.

In FIG. 5C an alternate arrangement is shown in which small, weak bridges 72 are formed between the semiconductor die 24. These bridges are sufficiently strong to retain the semiconductor die 24 in position when the whole wafer is heated to melt the gallium, but are weak enough to be broken in the transfer process. Here, the bridges are shown positioned at about the centre of each semiconductor die side, but it is understood that the bridges can be positioned elsewhere and there can be different numbers of them. For example, there could be one, two or more bridges 72 between each pair of adjacent semiconductor die 24, and the numbers and positions of them could change across the wafer.

In FIG. 5D, another alternate embodiment is shown in which small epitaxial spacer elements 74 are formed and the interfacial layer between spacer element and substrate is not decomposed during laser irradiation or melted during the subsequent heating stage. The spacer elements 74 serve to restrict the sideways movement of the semiconductor die 24 when the gallium layer 52 beneath the semiconductor die is melted.

In FIG. 5E, a further variation is shown, in which the surface of the host substrate 20 is prepared with wetting zones 78 and non-wetting zones 76. When the whole wafer is heated to reflow the gallium layer 52, the difference in wettability of the different zones 76, 78 of the upper surface of the host substrate 20 prevents the gallium from spreading. Surface tension between the semiconductor die 24 and the molten gallium helps to keep the semiconductor die 24 in position. Variations in wettability can be achieved by varying treatment of surface areas. For example, the host substrate 20 might be coated in selected regions with a layer of material that promotes surface wettability or inhibits surface wetting. For example, a layer of gallium oxide may be used. In a different example variation in wettability can be achieved in surface roughening selected regions of the host substrate 20.

In yet a different embodiment in FIG. 5F, the host substrate 20 is patterned prior to the growth of the epitaxial layer (forming semiconductor die 24) with grooves or ridges 79 of approximately the same size of the semiconductor die 24 that locate the semiconductor die 24 between the ridges 79 or grooves on the molten gallium 52.

In a further embodiment, the laser lift off step to release the functional layer or decompose a GaN layer between the substrate and the functional layer may be performed before the semiconductor die definition step or steps. For example, the stage shown in FIG. 4A may be completed before the stage shown in FIG. 2B.

Fourth Exemplary Embodiment of Method—Direct Laser Radiation Lift Off to Target Substrate In a fourth exemplary embodiment of the manufacturing method of the present invention shown in FIGS. 6A-6D, which is a variation of the above-described lift off techniques, the semiconductor die 24 are transferred off the host substrate 20 directly to a target substrate, for example, in the form of a film 80, rather than to a stamp.

In one embodiment, the target substrate film 80 is brought into contact with the semiconductor die 24 on the host substrate 20 and selected semiconductor die 24A are transferred directly to the target substrate film 80 via the technique described hereinafter.

The target substrate film 80 may be rigid or flexible and may have adhesive on it to facilitate the transfer of the semiconductor die 24A.

Figure 6A:
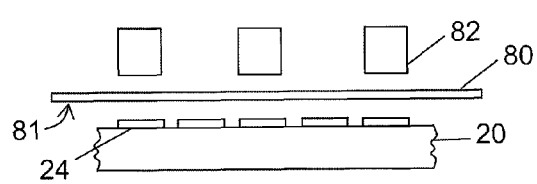
FIGS. 6A-6D schematically illustrate steps in a process for transferring semiconductor die from a substrate to a flexible film.
Figure 6B:
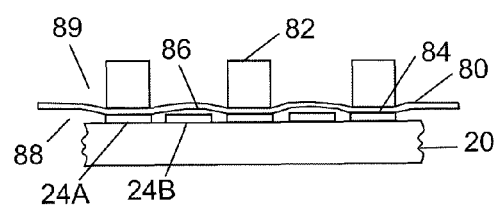

In one embodiment, the target substrate film 80 in FIG. 6A may be manufactured from PET (polyethylene teraphthalate), polyimide, polycarbonate or another plastic material and be provided with a thermal or UV curable adhesive on a surface 81 thereof that is to be contacted with semiconductor die 24A. Adhesive may be applied to the film surface 81 in specific areas where semiconductor die are desired, in larger areas, or all over its surface. The target substrate film 80 can be brought into close proximity with the semiconductor die 24 on the host substrate 20, aligned if necessary, and then deformed by pins 82 that push down on the film 80 to locally create contact between it and the semiconductor die 24A to be transferred. FIG. 6B shows the pins 82 lowered onto the film 80 which in turn is in good contact at interfaces 84 above the semiconductor die 24A to be transferred. The film 80 is not in contact, or is in poorer contact, in regions 86 above the semiconductor die 24B that are not to be immediately transferred from the host substrate 20. The utilization of pins is only one example of how to deform the target substrate and bring it into close contact with the semiconductor die to be transferred.

Figure 6C:
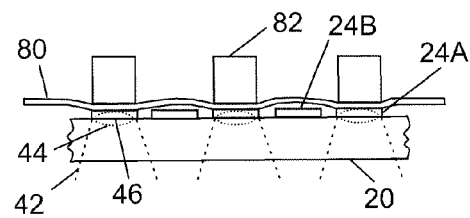

In FIG. 6C the semiconductor die 24A in contact with the film 80 are then subjected to a radiation lift off process, in which radiation 42, for example from a laser (not shown), is incident on localized zones 44 at or near the interfaces 46 below the semiconductor die 24A to be transferred.

Figure 6D:
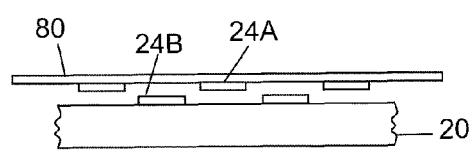

In FIG. 6D, the pins and film 80 are lifted or moved away from the host substrate 20, with semiconductor die 24A effectively transferred to the film 80 from the host substrate 20. The semiconductor die 24B that have not been in contact with the film 80, or not in good contact with the film 80, not in contact with the adhesive or not subject to radiation lift off, remain on the substrate 20. The adhesive between the semiconductor die 24A and the film 80 may be cured in the same step as (i.e., concurrently with) the radiation lift off step or it may be cured afterwards.

Adhesive may be applied to the target substrate film 80, the semiconductor die to be transferred 24A or both. The adhesive selection may include but is not limited to thermal or UV curing epoxy, electrically and thermally conductive or non conductive epoxy, UV or thermal curing silicon. Cure of the adhesive may occur through the target substrate or through the host substrate. In one embodiment the laser irradiation required to lift off the semiconductor die of the host substrate also concurrently activates the cure of the adhesive. Specifically, as shown in FIG. 6C, the proximity of zones 44 of radiation 42 to film surface 81 may activate the cure of the adhesive on film surface 81, thereby bonding the semiconductor die 24A to film 80, during the radiation lift off step.

In a different embodiment the adhesive is cured in a separate step prior to or after the lift off step. In one example the pins provide sufficient heat to the adhesive to enable cure. In a different example the pins are transparent to UV irradiation and guide UV light to the UV curable adhesive. In a different example the entire wafer is flooded with UV and cures the selectively dispensed adhesive. In a different example the host wafer is heated curing the selectively dispensed adhesive. In a different example the semiconductor die is absorptive to IR light and heating the adhesive in contact with the semiconductor die.

Alternatively the curing through temperature activated processes may be achieved through microwave radiation and disposition of a microwave absorptive layer in the substrate, in the adhesive or in the semiconductor die. Examples of microwave absorptive layers include waxes, resins, and polymers.

Figure 7:
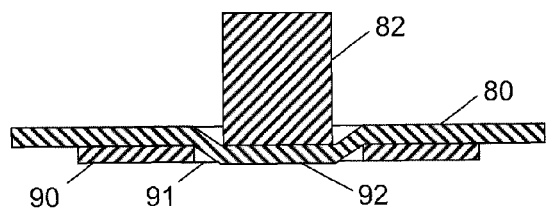
FIG. 7 is a schematic sectional view of a pin and grid assembly for transferring semiconductor die to a flexible film.

FIG. 7 shows a sectional view of a pin 82 that has deformed a target substrate such as film 80. The film 80 is supported on a template, a grid or mesh 90 with holes 91 that are aligned with the pins 82. The holes 91 are aligned with the semiconductor die 24A (not shown) to be transferred while the pins 82 press the film 80 into the holes 91 creating contact between the part 92 of the surface of the film 80 and the semiconductor die 24A.

Figure 10A:
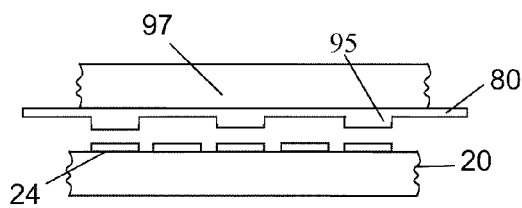
FIGS. 10A-10C schematically illustrate direct transfer of transferring semiconductor die using solder with a substrate including a mesa structure.
Figure 10B:
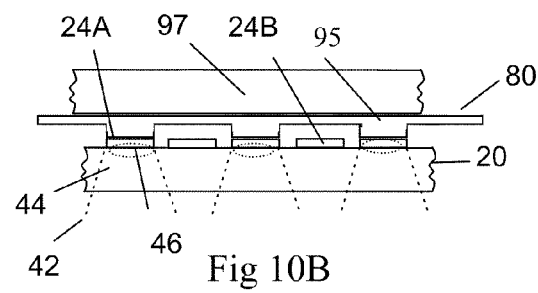
Figure 10C:
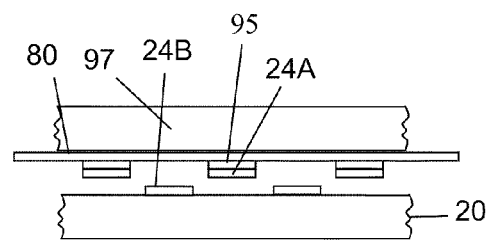

In a different embodiment shown in FIGS. 10A-10C mesas 95 are defined on the target substrate 80 that will receive the semiconductor die 24A after radiation lift off. The mesas 95 can be selectively coated with adhesive or solder. The target substrate 80 can be manufactured out of rigid material, such as glass, or be flexible. In the case that a flexible substrate is used, a backing layer 97 or other means may be required to ensure conformal contact to the semiconductor die in step 2 (FIG. 10B). The backing layer may be hard and flat or flexible such as the composite stamp discussed in previous embodiments. For example, a flexible substrate 80 with mesas 95 and adhesive deposited on the mesas is supported by a backing layer 97 and brought into contact with selected semiconductor die 24A. The adhesive is cured in any of above mentioned ways, for example by thermal cure, attaching the semiconductor die 24A to the target substrate 80. In a following step the semiconductor die 24A are released from the host substrate 20 by laser irradiation 42.

Figure 8A:
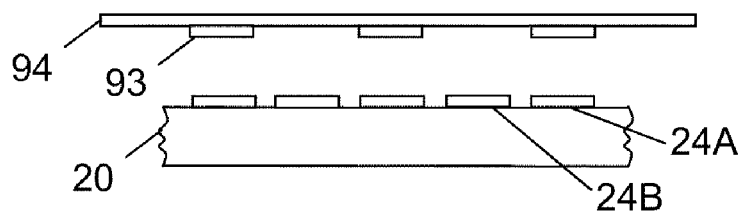
FIGS. 8A-8D schematically illustrate steps in transferring semiconductor die using solder.

Fifth Exemplary Embodiment of Method—Direct Radiation Lift Off to Target Substrate Using Solder A fifth exemplary embodiment of the manufacturing method of the present invention is shown in FIGS. 8A-8E. In FIG. 8A a solder 93, such as low temperature solder including SnIn, SnBi, SnBiAg, is disposed on the target substrate 94, which could for example be a PET film, in areas where semiconductor die 24A are to be transferred to. A magnetic nanoparticle solder heated by radio-frequency induction may alternatively be employed.

Figure 8B:
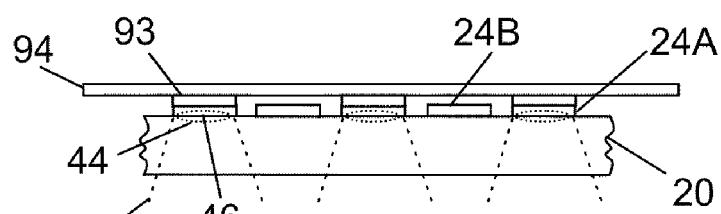

In FIG. 8B, a radiation lift off step occurs, in which radiation 42 from a suitable source, such as a laser (not shown), is brought into focus in regions 44 at the interfaces 46 between the semiconductor die 24A to be transferred and the host substrate 20.

Figure 8C:
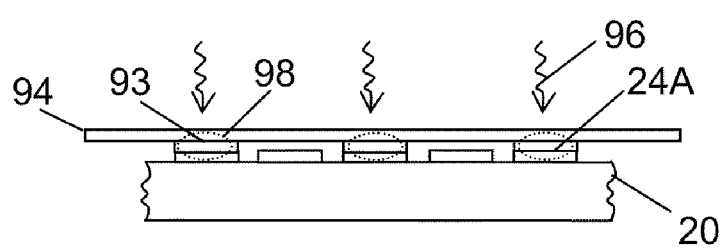

In FIG. 8C, heat 96 is applied to produce localized heating zones 98 in order to reflow the solder 93 in contact with the semiconductor die 24A to be transferred from host substrate 20 to target substrate 94. On removal of the heat source 96 and solidification of the reflowed solder 93, the semiconductor die 24A are effectively bonded to the target substrate 94. Heat can be applied to the entire substrate, to a portion of the substrate, or to one or more selected semiconductor die.

Figure 8D:
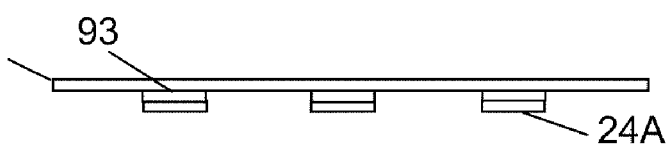

In an alternate embodiment, the laser irradiation 42 in FIG. 8B may serve to decompose GaN at an interface 46 leaving the semiconductor die attached to the host substrate 20 with the metallic gallium layer, rather than releasing the semiconductor die from the host substrate completely. In a subsequent step in FIG. 8C, the localized heated zone 98 used to reflow the solder 93 may also reflow the gallium layer and release the semiconductor die. The duration and intensity of applied heat 96, and temperatures of the zones 98 may be carefully controlled to allow the reflowed solder 93 to solidify, without solidifying the gallium, before the target substrate 94 is moved away from the host substrate 20. FIG. 8D shows the result, wherein semiconductor die 24A are bonded with solder 93 to target substrate 94.

Figure 8E:
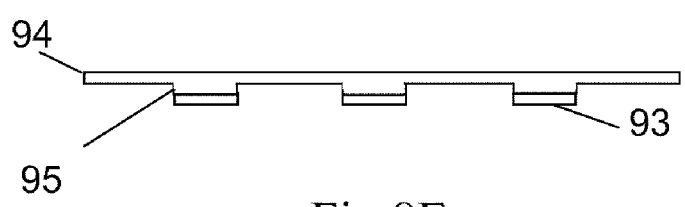
FIG. 8E is a schematic sectional view of a substrate with mesa structure.

In an alternate embodiment, the solder attach step FIG. 8C may be performed prior to the radiation lift off step of FIG. 8B. Heat may be applied via infra red radiation or via conduction or other means through the target substrate 94. Low temperature solder may be deposited on the target substrate 94, the semiconductor die 24A to be transferred, or both. The target substrate 94 may have a surface pattern with mesas 95, as seen in FIG. 8E, being defined in regions where semiconductor die are to be transferred to. Solder 93 can be selectively deposited on the mesas 95.

Sixth Exemplary Embodiment of Method—Pd-In Bonding

In a sixth exemplary embodiment of the manufacturing method of the present invention, a Pd-In bonding process may be used to bond the semiconductor die to the target or carrier substrate as an alternative to use of the solder in FIGS. 8A and 8B. A metal stack with a Pd final layer can be deposited on the semiconductor die and a Pd-In metallization can be deposited on the target substrate. A variety of wetting layers such as Ti or W may be deposited and diffusion barrier layers such as Pt, Cr, Ni may also be deposited prior to depositing the Pd layer on the semiconductor die. Once the target substrate and the semiconductor die are in contact, localized heating can be applied to reflow the indium, and interdiffusion will create an $In_3Pd$ alloy with a melting temperature of over 600° C. This layer can also function as a mirror layer.

In a further embodiment where the semiconductor die are LEDs, the surface of the semiconductor die may be patterned to enhance its light extraction efficiency, prior to the deposition of a p contact. A suitable p-contact may include materials such as Pd, Ag, Al that can also serve as mirrors.

In one example, the IR heating source can be a graphic arts printing head such as supplied by Kodak.

Flowchart of Indirect Transfer of Semiconductor Die

Figure 9A:
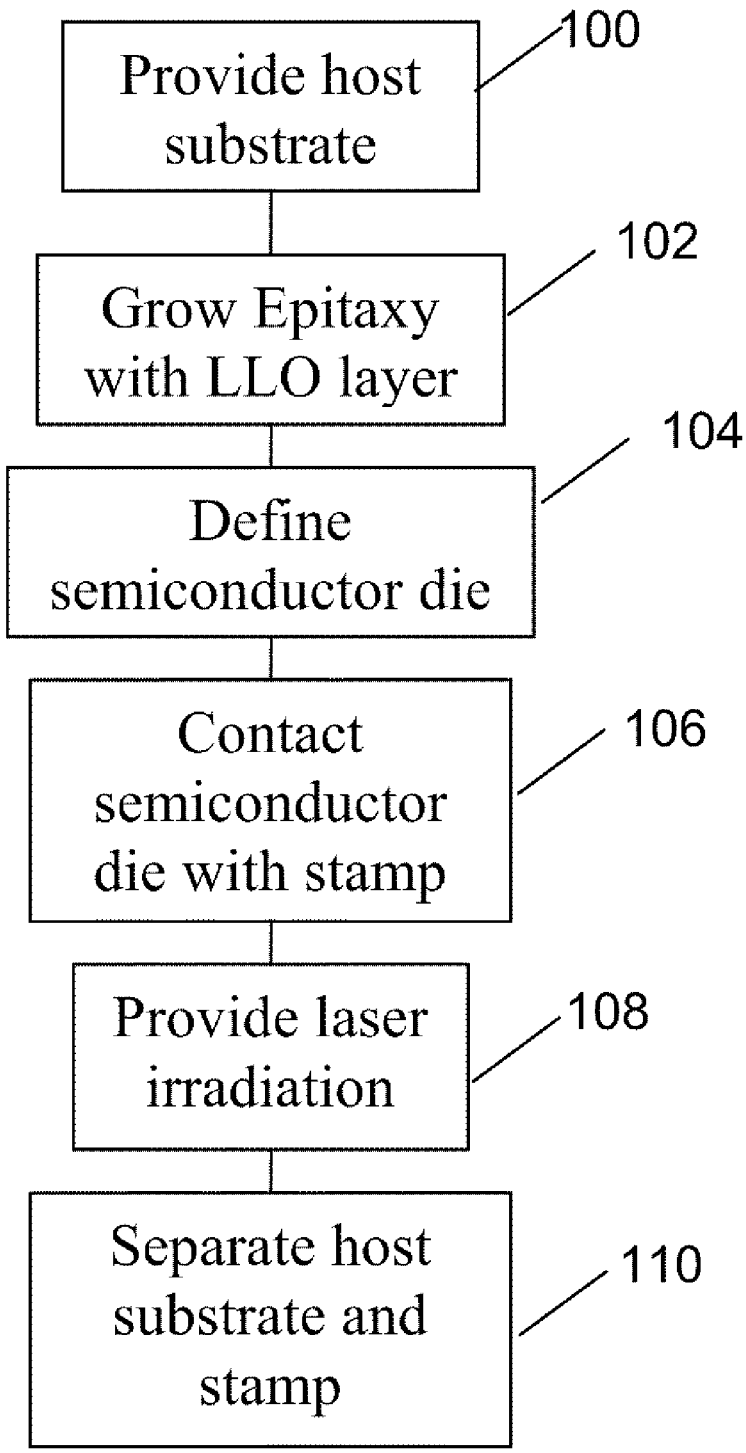
FIGS. 9A and 9B depict flowcharts according to the method of the present invention.

FIG. 9A shows a flowchart of the main steps of the manufacturing method of the present invention, incorporating indirect transfer of semiconductor die. In step 100, a host substrate is provided. An epitaxial layer is deposited 102 on the host substrate, which may include a layer that allows for radiation lift off. Semiconductor die are defined and further processed, as necessary, in step 104. A transfer device such as a composite stamp is brought into contact, as per step 106, with selected semiconductor die forming a bond between semiconductor die and transfer device. Application of laser radiation, as per step 108, results in release of individual semiconductor die from the host substrate. The semiconductor die, adhered to the transfer surface, are then removed, as per step 110, from the host substrate for transfer to a target substrate.

Flowchart of Direct Transfer of Semiconductor Die

Figure 9B:
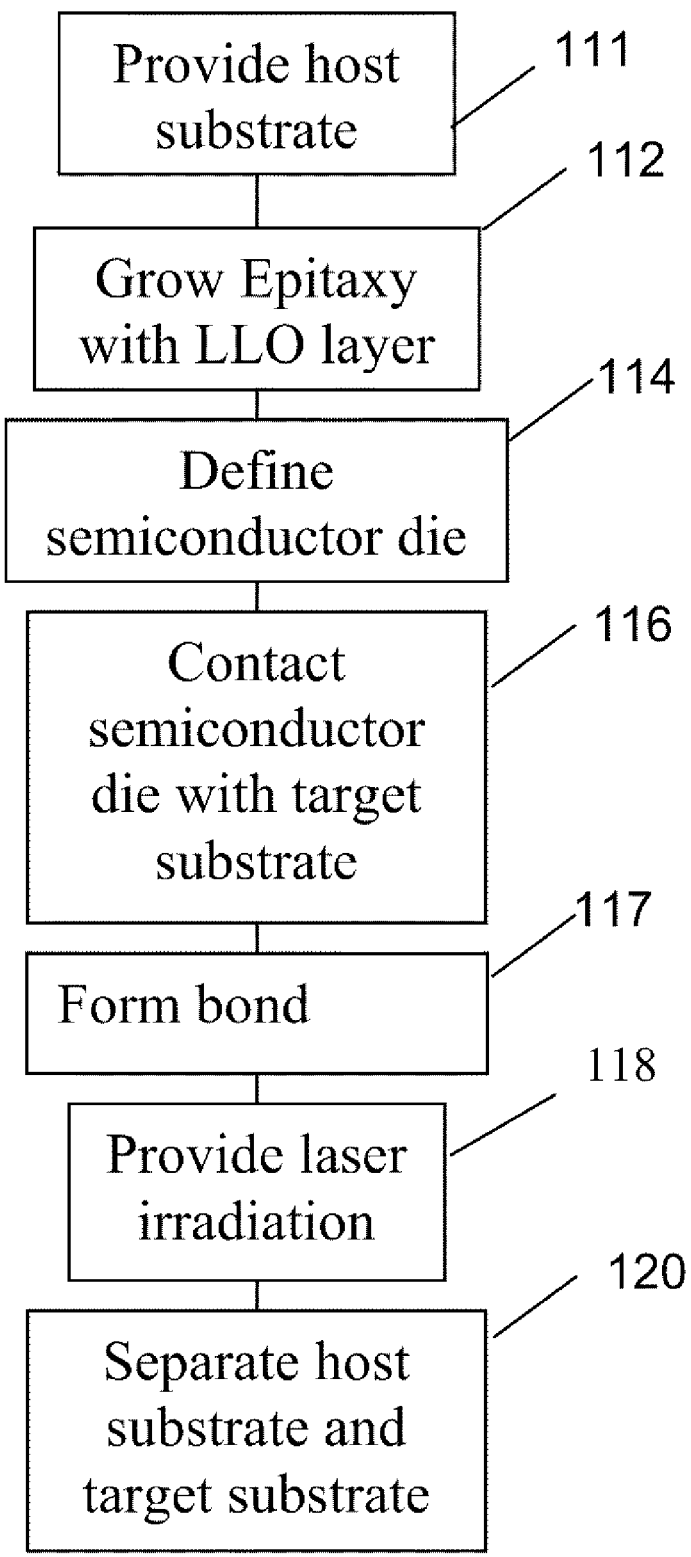

FIG. 9B shows a flowchart of the main steps of the manufacturing method of the present invention, incorporating direct transfer of semiconductor die. In step 111, a host substrate is provided. An epitaxial layer is deposited, as per step 112, on the host substrate, which may include a layer that allows for radiation lift off. Semiconductor die are defined and further processed, as necessary, in step 114. A target substrate with adhesive deposited is brought into contact, as per step 116, with selected semiconductor die and, as per step 117, a bond between semiconductor die is formed by curing the adhesive. Application of laser radiation, as per step 118, results in release of individual semiconductor die from the host substrate. The semiconductor die, adhered to the target substrate are then removed, as per step 120, from the host substrate.

Seventh Exemplary Embodiment of Method—Differentially Cured Adhesive Layer

A multilayer InGaN film is epitaxially grown on a sapphire substrate using known techniques that result in optimal light-emitting diode performance due to minimal lattice mismatches. The film may optionally be patterned using known techniques to enhance light extraction. The film is then removed intact from the sapphire substrate using a laser-assisted liftoff technique and adhesively bonded to an intermediate substrate. The other side of the film is then coated with photoresist and selectively etched to form semiconductor die. In doing so, the underlying adhesive layer between the semiconductor die is exposed. The exposed adhesive layer is then optionally removed by a suitable solvent, thereby forming semiconductor die connected to the remaining InGaN film by bridges that can be fractured for removal from the wafer by means of for example an elastomeric transfer stamp.

Figure 11:
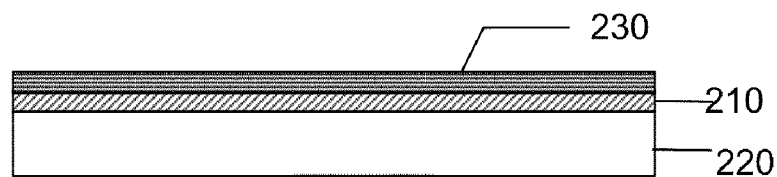
FIG. 11 is a schematic view of a host substrate with a buffer layer and semiconductor layer.

FIG. 11 shows that a buffer layer of gallium nitride (GaN) 210 is epitaxially grown on a sapphire substrate 220 using for example metalorganic chemical vapor deposition (MOCVD) techniques, followed by successive layers of indium-gallium nitride (InGaN) 230 to form a light-emitting semiconductor film.

The semiconductor film is optionally processed by wet chemical or plasma etching means to roughen the exposed top surface of InGaN layer 230 and thereby provide improved light extraction from the light-emitting film.

Figure 12:
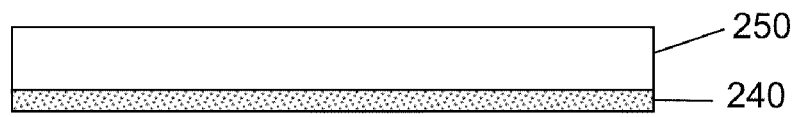
FIG. 12 is a schematic view of a transparent intermediate substrate with an adhesive layer on its underside.

In FIG. 12, a layer of polymerizable adhesive material 240 is applied to the underside of a transparent substrate 250 such as glass using for example known spin-coating techniques, wherein polymerization makes the adhesive material resistant to solvents.

Figure 13:
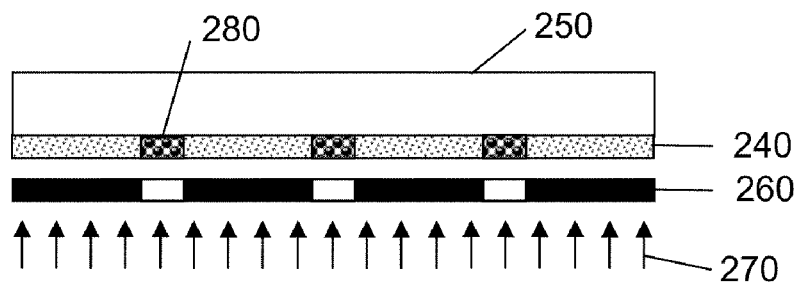
FIG. 13 schematically illustrates irradiation of the adhesive layer through a mask.

FIG. 13 shows that the adhesive layer 240 is selectively exposed through an opaque mask 260 to actinic radiation 270 such as near-ultraviolet light to create patterns of polymerized material 280.

Figure 14:
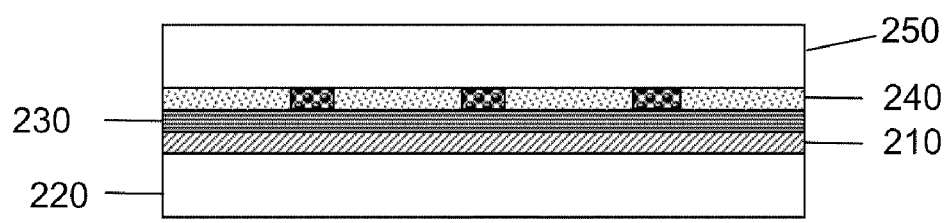
FIG. 14 is a schematic view of the host substrate, with buffer and semiconductor layers, adhered to the intermediate substrate.

In FIG. 14, the semiconductor film 230 is bonded via the adhesive layer 240 to the transparent substrate 250.

Figure 15:
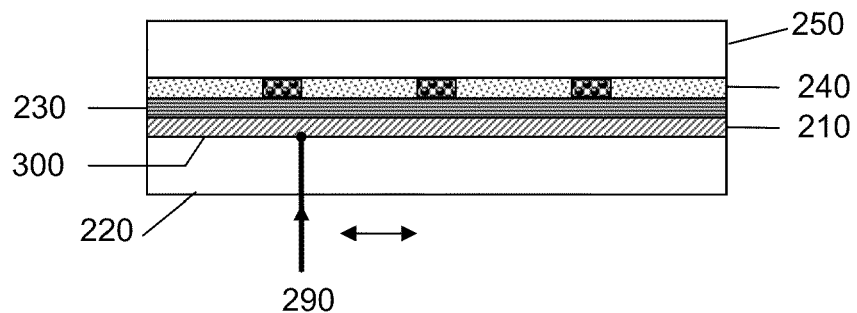
FIG. 15 schematically illustrates irradiation of the buffer layer.

In FIG. 15, an ultraviolet laser beam 290 such as for example that generated by a KrF excimer or Q-switched Nd:YAG laser is directed through the optically transparent sapphire substrate 220 onto the GaN buffer layer 210. The ultraviolet laser beam 290 is focused into a spot that provides sufficient energy, for example 400 to 600 milliJoules per square centimeter within a 38 nanosecond pulse, to induce rapid thermal decomposition of the GaN at the GaN/sapphire interface 300. The decomposition yields metallic Ga and nitrogen gas.

In a preferred embodiment, the laser beam 290 can be mechanically or acousto-optically scanned across the sapphire substrate 220 to uniformly decompose the GaN buffer layer 210 into metallic Ga and nitrogen gas.

Figure 16:
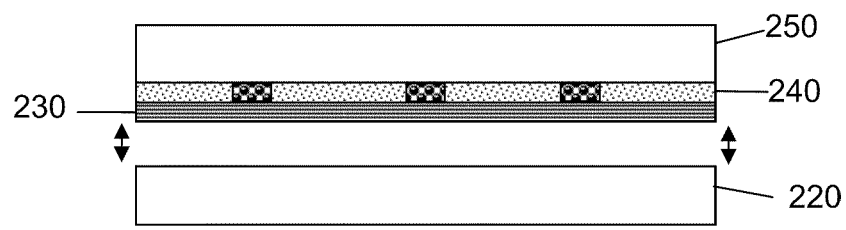
FIG. 16 schematically illustrates separation of the host substrate from the semiconductor layer, which is adhesively attached to the intermediate substrate.

The bonded assembly is then heated to approximately 30 degrees Celsius to melt the metallic Ga layer 210, thereby enabling the InGaN semiconductor film to be mechanically separated from the sapphire substrate 220 as shown in FIG. 16.

Figure 17:
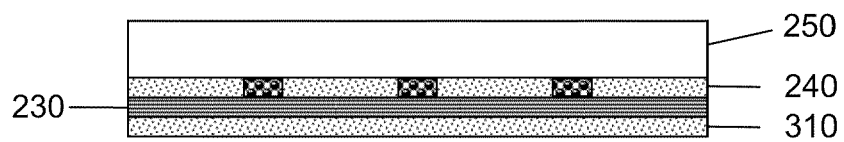
FIG. 17 is a schematic view of a layer of photoresist added to the semiconductor layer.

A layer of photoresist material 310 such as for example the epoxy-based negative photoresist commonly referred to as SU-8 is applied to the InGaN semiconductor film 230 using for example known spin-coating techniques, as shown in FIG. 17.

Figure 18:
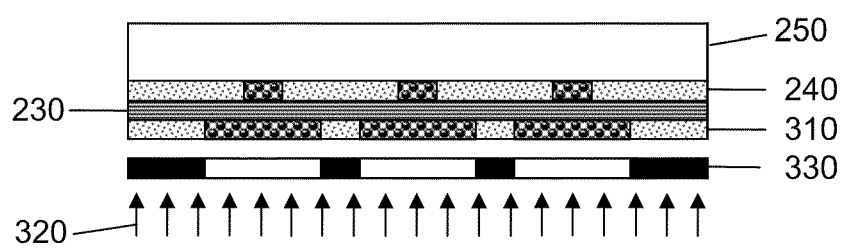
FIG. 18 schematically illustrates irradiation of the photoresist layer through a mask.

In FIG. 18, the photoresist layer 310 is selectively exposed to actinic radiation 320 through an opaque mask 330 such as near-ultraviolet light to create patterns of polymerized material that are aligned with the previously polymerized adhesive layer 240.

Figure 19:
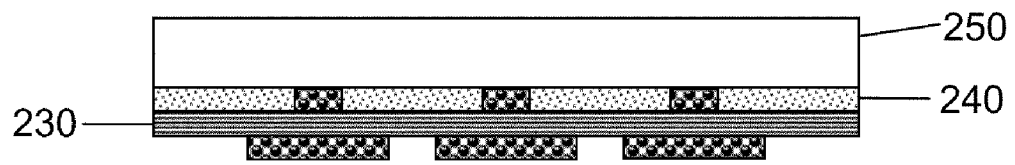
FIG. 19 schematically illustrates removal of unexposed photoresist.

In FIG. 19, the photoresist layer 310 is chemically etched with a suitable solvent to remove the unpolymerized material and thereby expose the underlying InGaN semiconductor film 230.

Figure 20:
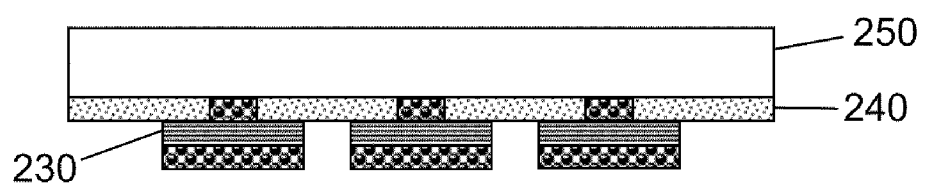
FIG. 20 schematically illustrates removal of etched portions of the semiconductor layer.

In FIG. 20, the exposed InGaN semiconductor film 230 is further chemically etched to expose the underlying adhesive layer 240 bonding the film to the substrate 250

In a preferred embodiment, a photoelectrochemical etching process as disclosed for example by Kamler et al. (Kamler, G., B. Lucznik, B. Pastuszka, I. Grzegory, and S. Porowski. 2008. "High Rate Photoelectrochemical Etching of GaN and the Use of Patterned Substrates for HVPE Regrowth," Journal of Crystal Growth 310:3478-3481) is employed to etch the exposed InGaN semiconductor film 230.

Alternately, known dry etching techniques such as reactive ion etching (RIE), electron cyclotron resonance (ECR), and inductively-coupled plasma (ICP) etching, may also be employed.

Figure 21:
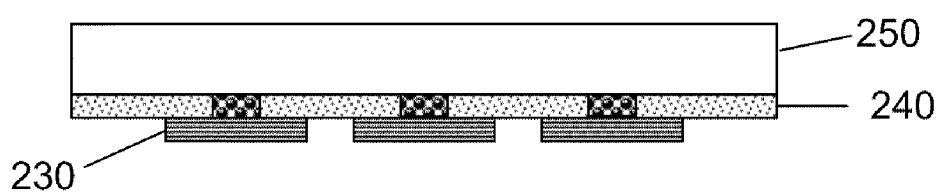
FIG. 21 schematically illustrates removal of the exposed photoresist.

In FIG. 21, the polymerized photoresist 310 is removed from the etched InGaN semiconductor film 230 using a suitable solvent.

Figure 22:
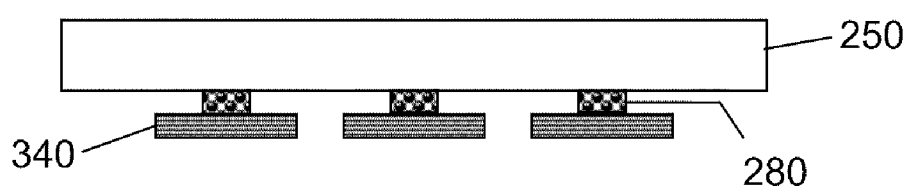
FIG. 22 schematically illustrates removal of the non-irradiated portions of adhesive.

As shown in FIG. 22, the unpolymerized regions of the adhesive layer 240 are then removed using a suitable solvent, thereby forming undercut semiconductor die 340 that are joined to the intermediate transparent substrate 250 with the polymerized regions of adhesive 280.

Figure 23A:
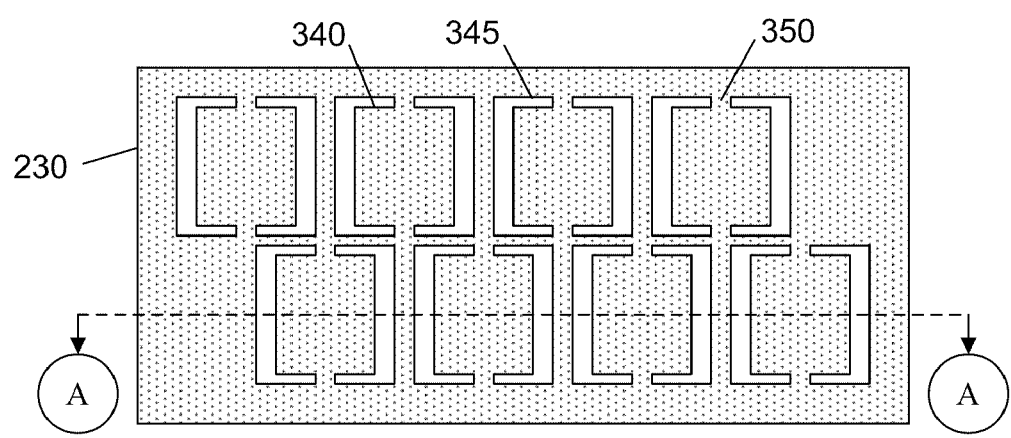
FIG. 23A is a schematic plan view of a pattern of semiconductor die connected to the outer portion of the semiconductor layer with bridges.
Figure 23B:
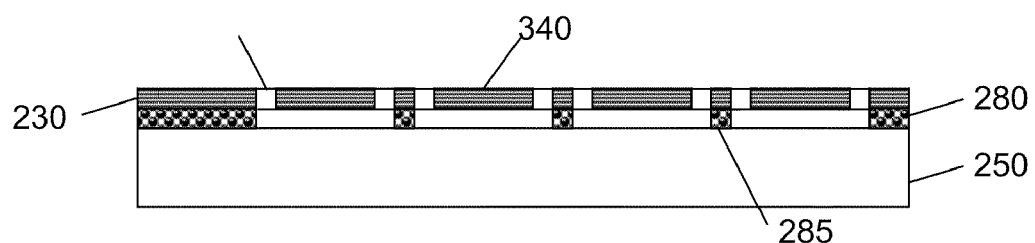
FIG. 23B is a schematic sectional view of the pattern as seen along line A-A of FIG. 23A.

Different arrangements of semiconductor die can be used. An example of an arrangement of semiconductor die is shown in plan view in FIG. 23A and in section in FIG. 23B, which illustrates a view on Section A-A marked in FIG. 23A. Referring to FIG. 23A, the undercut semiconductor die 340 are almost entirely surrounded by etched away gaps 345 in the semiconductor layer, and are only connected via bridges 350 to the peripheral area of semiconductor material 230. The bridges 350 can be fractured for removal of the semiconductor die 340 from the substrate 250 by means of for example an elastomeric transfer stamp (not shown). The semiconductor die 340 do not have polymerized adhesive beneath them, as can be seen in FIG. 23B, and further, the unpolymerized adhesive has already been dissolved away. The peripheral area of semiconductor layer 230 is connected via polymerized adhesive 280 to the substrate 250. Also, the adhesive layer may have been polymerized at various other positions 285.

Figure 24:
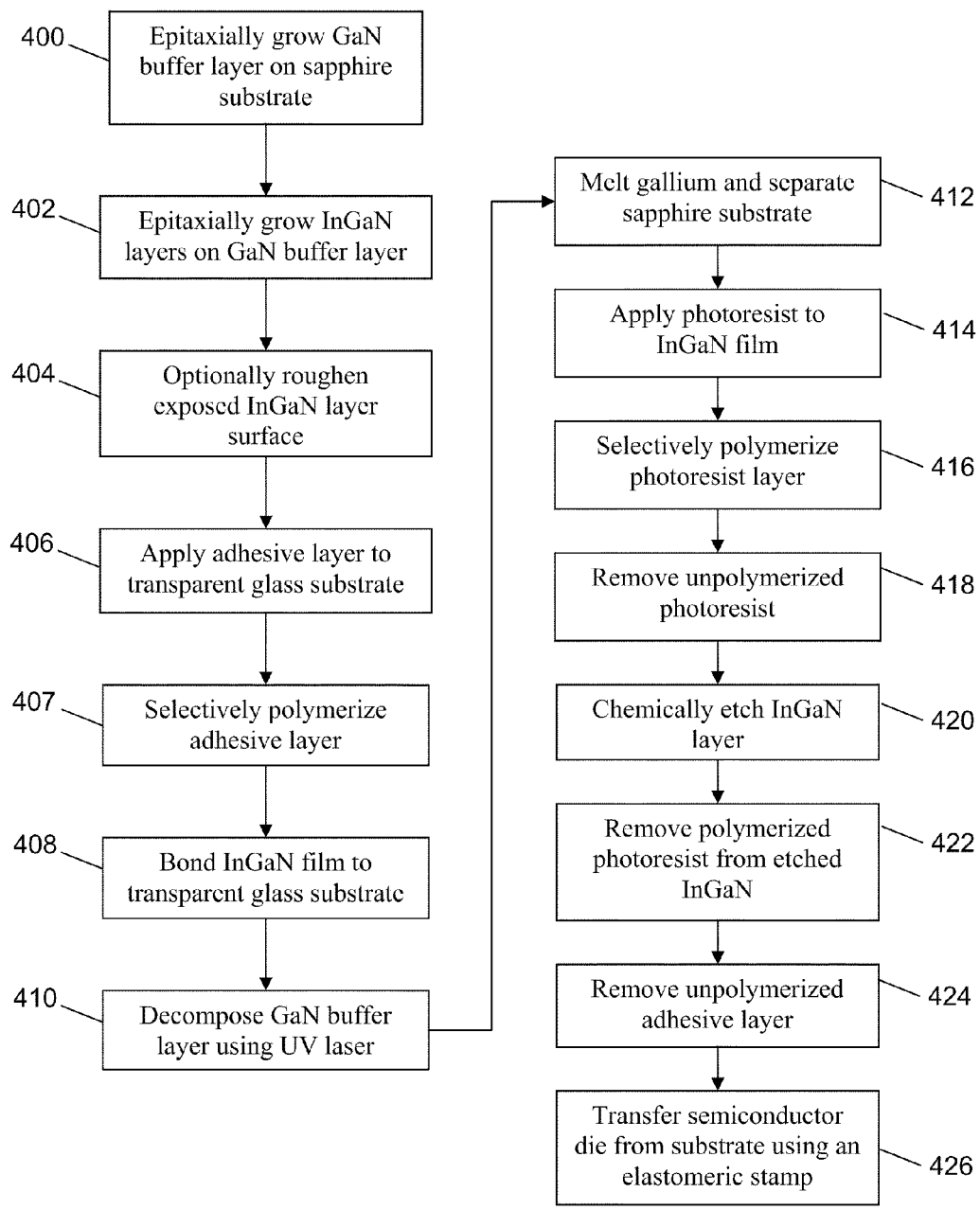
FIG. 24 depicts a flowchart of another method of the present invention as shown through FIGS. 11-23B.

A flowchart of the above method is presented in FIG. 24. The initial step 400 is to epitaxially grow a GaN buffer layer on a sapphire substrate. Then, in step 402, InGaN layers are epitaxially grown on the GaN buffer layer. Optionally, in step 404, the exposed surface of the InGaN layer can be roughened to increase light output. An adhesive layer is applied to a transparent glass substrate in step 406, and the adhesive layer is then selectively polymerized 407. Step 408 is to bond the InGaN film to the transparent glass substrate using the adhesive. In step 410, the GaN buffer layer is decomposed using a UV laser. Heating of the assembly then occurs 412 to melt the gallium and allow for removal of the sapphire substrate from the assembly. Photoresist is then applied 414 to InGaN film, selectively polymerized 416, followed by removal 418 of the unpolymerized photoresist. The next step 420 is to chemically etch the InGaN layer to form semiconductor die. Polymerized photoresist is then removed 422 from the etched InGaN. The unpolymerized parts of the adhesive layer are then removed 424. Finally, the semiconductor die are transferred 426 from the transparent intermediate substrate using for example an elastomeric stamp.

Eighth Exemplary Embodiment of Method—Curing to Selectively Reduce Adhesive Force of Adhesive Layer In an alternate embodiment, the polymerizable adhesive layer 240 (FIG. 12) is an ultraviolet-curable polymer whose adhesive force can be reduced upon exposure to ultraviolet radiation in a curing stage. Suitable polymers are disclosed in for example U.S. Pat. No. 5,538,771. A commercial example of said polymer is the DT-UV-203 acrylic dicing tape manufactured by Semiconductor Tapes and Materials (San Jose, Calif.), wherein exposure of the tape to approximately 150 milliJoules per square centimeter reduces the adhesive force from approximately 100 newtons per square centimeter to less than 12 newtons per square centimeter.

In contrast to the seventh embodiment, regions of the adhesive layer 240 are not removed (Step 424) using a suitable solvent to form undercut semiconductor die 340. Instead, by selectively reducing the adhesive force of the underlying adhesive layer corresponding to locations of the semiconductor die 340, the semiconductor die may be removed from the substrate 250 by means of for example an elastomeric transfer stamp.

U.S. Pat. No. 6,410,151 discloses a method of selectively irradiating semiconductor die affixed to dicing tape. However, this method requires that a semiconductor wafer be affixed to the dicing tape and then cut into individual semiconductor die prior to irradiation and removal. A disadvantage of this method is that the elastomeric and thermal expansion properties of the dicing tape may allow for movement and subsequent misalignment of the semiconductor die after cutting. The present embodiment of the invention, by comparison, relies on bridges 350 (FIG. 23A) to maintain precise alignment of semiconductor die 340 until removal by the transfer tool.

Figure 25:
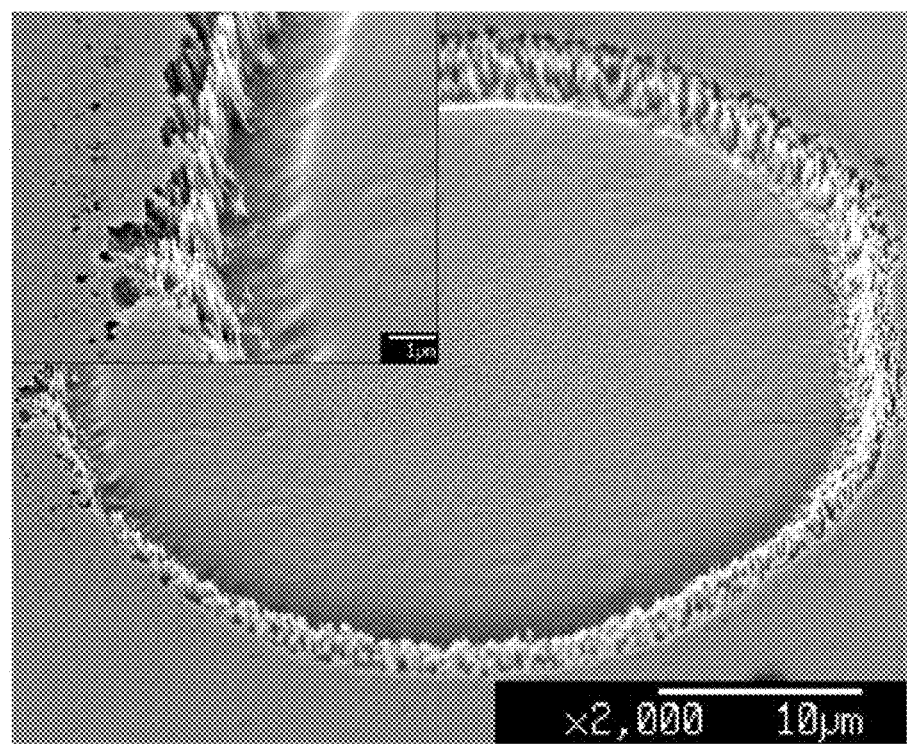
FIG. 25 is a photomicrograph of the prior art negative crowning effect.

A photoelectrochemical etching process as disclosed for example by Kamler et al. is employed to etch the exposed InGaN semiconductor film 230. As noted by Macht et al. (Macht, L, J. J. Kelly, J. L. Weyher, A. Grzegorczyk, and P. K. Larsen. 2005. "An Electrochemical Study of Photoetching of Heteroepitaxial GaN: Kinetics and Morphology," Journal of Crystal Growth 275:347-356.), said process tends to produce greater etching rates at mask edges. This results in a "negative crowning" effect, where the etch depth at the mask edges is greater than the surrounding region (e.g., FIG. 25, from Macht et al.). While this effect is generally undesirable in semiconductor wafer processing, it is a particular advantage with respect to the present embodiment in that semiconductor die 340 can be etched from the InGaN semiconductor film 230 without the need for bridges.

Figure 26A:
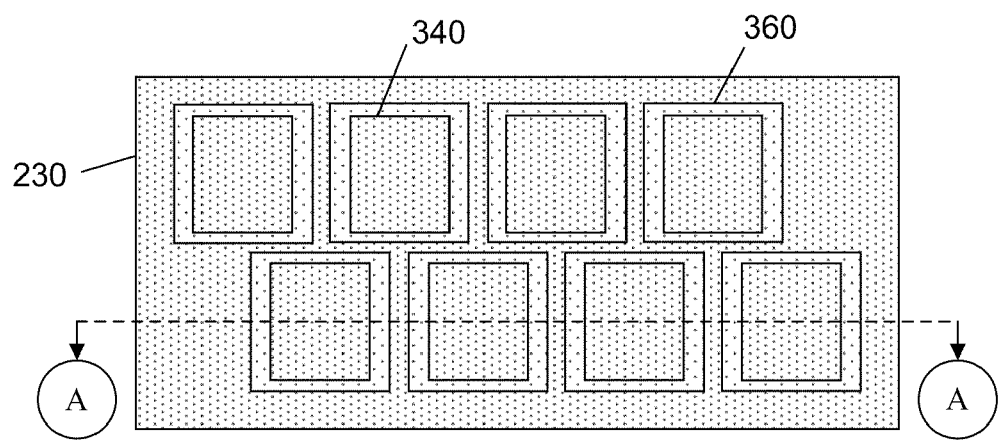
FIG. 26A is a schematic plan view of a pattern of semiconductor die surrounded by semiconductor regions etched with a negative crowning effect, on a layer of adhesive that has been selectively weakened under the semiconductor die.
Figure 26B:
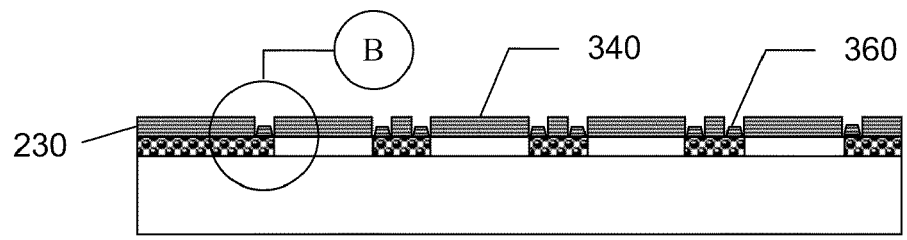
FIG. 26B is a schematic sectional view of the pattern as seen along A-A of FIG. 26A.
Figure 26C:
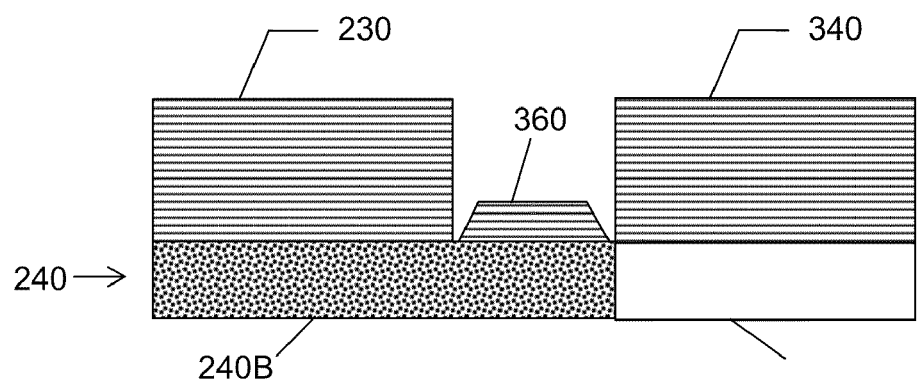
FIG. 26C is an enlarged schematic view of the portion encircled at B in FIG. 26B.

Referring to FIG. 26A, the area 360 of the semiconductor layer 230 surrounding semiconductor die 340 is partially removed using a photoelectrochemical etching process. In FIG. 26B, which is a view of Section A-A of FIG. 26A, due to the negative crowning effect, the edges of area 360 are etched at a faster rate, resulting in the regions adjacent to semiconductor die 340 and the surrounding InGaN semiconductor film 230 being removed while the central region of area 360 remains. FIG. 26C shows a close up of Detail B of FIG. 26A.

The adhesive layer 240 is then selectively irradiated underneath semiconductor die 340 to reduce its adhesive force in regions 240A and to thereby enable said semiconductor die to be removed with a transfer tool. There is little or no irradiation in regions 240B of the adhesive layer 240, which allows the strength of the adhesive layer portions 240B to remain high.

To align the selective irradiation pattern for weakening the adhesive, a machine vision system can be used to determine the position and orientation of the semiconductor die. The etched areas 360 should be thin enough that they can be back-illuminated. Alternately, a pin registration system can be used to align the substrate during masking of the InGaN film prior to etching and subsequent irradiation of the adhesive layer. Pin registration may already be used in the processing of the semiconductor wafer with multiple mask-and-etch steps.

For selective irradiation of the adhesive layer, an opaque mask may be aligned with the substrate, using either of the techniques above, and the assembly simultaneously exposed to an incoherent UV light source, such as a high-intensity mercury short-arc lamp. A mechanical shutter may be used to control the exposure time.

Alternately, a continuous or pulsed UV or near-UV laser may be focused to a small point on the adhesive layer and raster-scanned to sequentially expose the adhesive layer. The raster scanner can be a two-axis scanning mirror assembly or an acousto-optic scanner. With a continuous laser, a mechanical shutter may be used to limit the exposure.

Optionally, the entire adhesive layer could be irradiated, but the width of the semiconductor film 360 surrounding the semiconductor die 340 would need to be wide enough to withstand the force required to separate the semiconductor die from the surrounding areas 360.

A first particular advantage of this embodiment is that the remaining area 360 (Detail B) of the semiconductor layer 230 functions as a mechanical stop when aligning semiconductor die 340 with the transfer tool. If the InGaN film comprising area 360 were completely removed by means of for example reactive ion etching or another process that does not exhibit negative crowning effects, the semiconductor die 340 could potentially move horizontally when being attached to the transfer tool, resulting in misalignment.

A second particular advantage of this embodiment is that semiconductor die 340 remains firmly attached to and supported by adhesive layer 240. There is therefore a reduced risk of mechanical damage to the semiconductor die when compared to the previously disclosed undercut semiconductor semiconductor die (FIG. 23A-B). For example, with undercut semiconductor die it is possible that the application of excessive force by the transfer tool may fracture the bridges 350 but not bind semiconductor die 340 to the transfer tool.

A third particular advantage of this embodiment is that the etched edges of semiconductor die 340 are uniformly smooth and so conducive to the extraction of luminous flux. By comparison, the previously disclosed undercut semiconductor die will have rough edges due to the fractured bridges 350, which will tend to inhibit the extraction of luminous flux. This is particularly important for small light-emitting diodes designed to emit from their edges only.

A fourth particular advantage of this embodiment is that the adhesive layer 240A underneath semiconductor die 340 can be selectively irradiated only for selected semiconductor die. The remaining semiconductor die remain firmly attached to and supported by adhesive layer 240B, and they can then later be removed by further irradiation of the respective areas of adhesive.

Note that alignment tolerance may be relaxed relative to that shown in the figures, depending on the requirements of the process.

Figure 27:
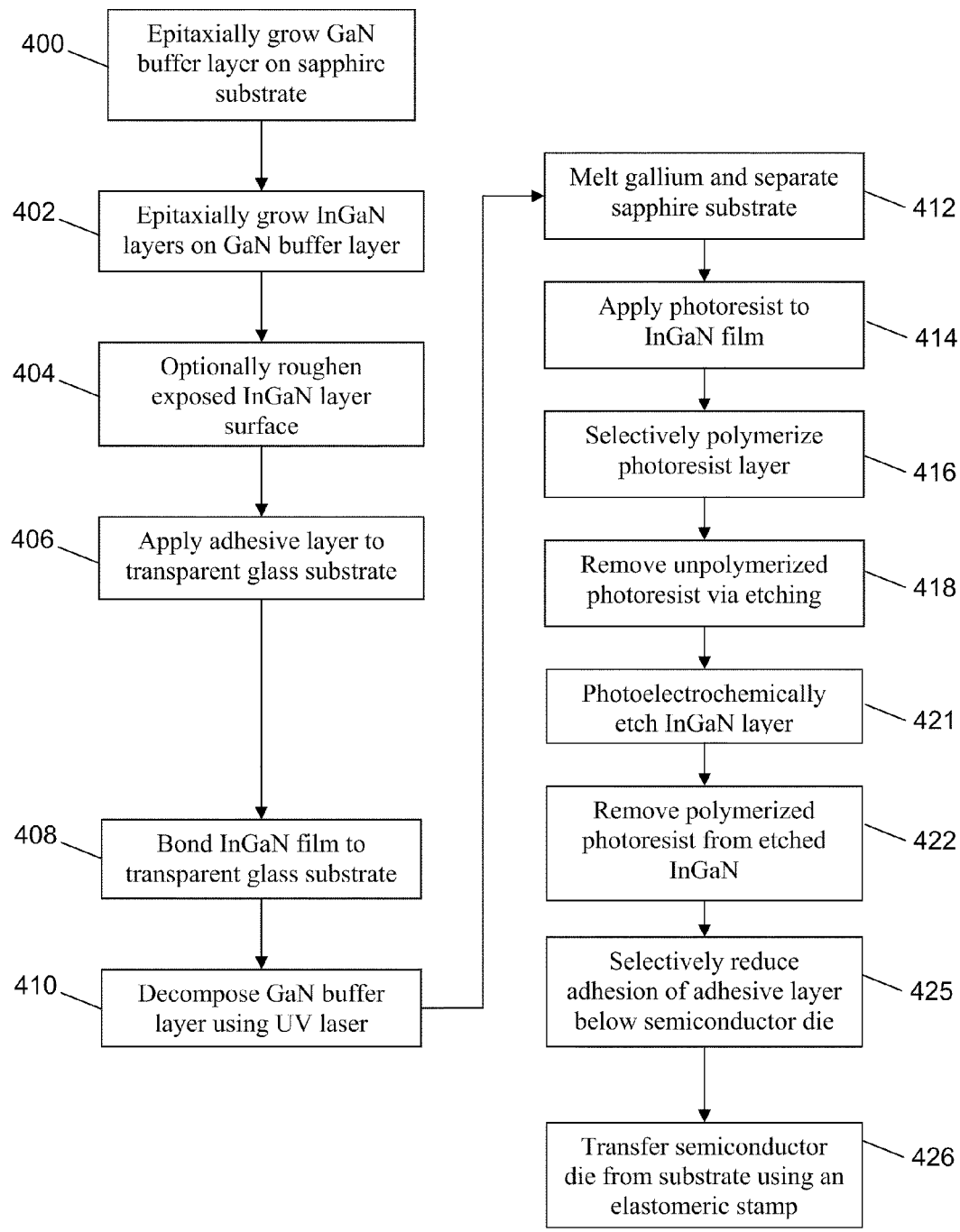
FIG. 27 depicts a flowchart of another method of the present invention for forming the semiconductor die as shown in FIGS. 26A-26C.

A flowchart of the above method is presented in FIG. 27. The first step 400 is to epitaxially grow a GaN buffer layer on a sapphire substrate. Then, in step 402, InGaN layers are epitaxially grown on the GaN buffer layer. Optionally, in step 404, the exposed surface of the InGaN layer can be roughened to increase light output. An adhesive layer is applied to a transparent glass substrate in step 406, where the adhesive is one that can be later cured to reduce its adhesive force. Step 408 is to bond the InGaN film to the transparent glass substrate using the adhesive. In step 410, the GaN buffer layer is decomposed using a UV laser. Heating of the assembly then occurs 412 to melt the gallium and allow for removal of the sapphire substrate from the assembly. Photoresist is then applied 414 to InGaN film, selectively polymerized 416, followed by removal 418 of the unpolymerized photoresist via etching.

The next step 421 is to photoelectrochemically etch the InGaN layer using the negative crown effect to form semiconductor die. Polymerized photoresist is then removed 422 from the etched InGaN. Using UV radiation, the next step 425 is to selectively reduce adhesion of adhesive layer below the semiconductor die. Finally, the semiconductor die are transferred 426 from the transparent intermediate substrate using for example an elastomeric stamp.

Ninth Exemplary Embodiment of Method—Using Intermediate Substrate with Mesas

Figure 28A:
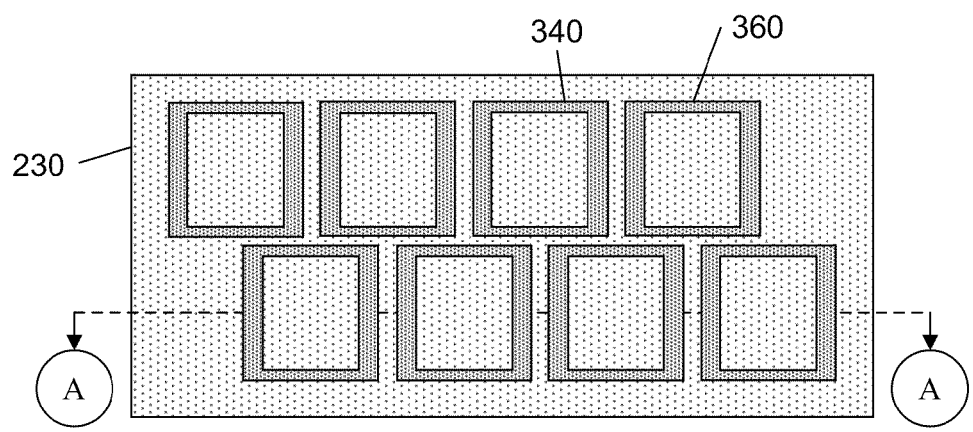
FIGS. 28A-28C is a schematic view of a pattern of semiconductor die surrounded by semiconductor regions etched with a negative crowning effect, where the semiconductor die are aligned with mesas in the intermediate substrate.
Figure 28B:
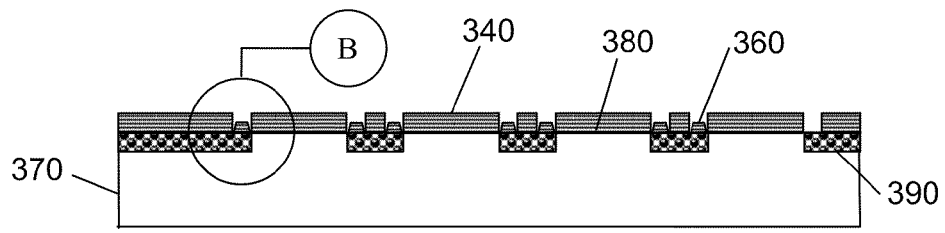

In another alternate embodiment, the transparent intermediate substrate 250 of FIG. 12 is replaced with a transparent substrate 370 that is etched or milled to generate mesas 380, as shown in FIG. 28B.

An adhesive layer 390 is deposited onto the areas surrounding the mesas 380 by means, for example, of an inked elastomeric stamp. Other means of applying the adhesive layer may also be employed, as will be known to those skilled in the art of intaglio printing. Compared to the seventh embodiment, there is no need for the adhesive layer to be selectively polymerized to provide areas of different adhesive strength.

The InGaN semiconductor film 230 is then bonded to substrate 370 and removed from its host substrate by means of laser-assisted liftoff, following which the semiconductor die 340 are generated by means of photoelectrochemical etching as disclosed in the eighth embodiment.

The photoelectrochemical etching of the InGaN semiconductor film 230 results in semiconductor die 340 that are aligned with the mesas 380.

Figure 28C:
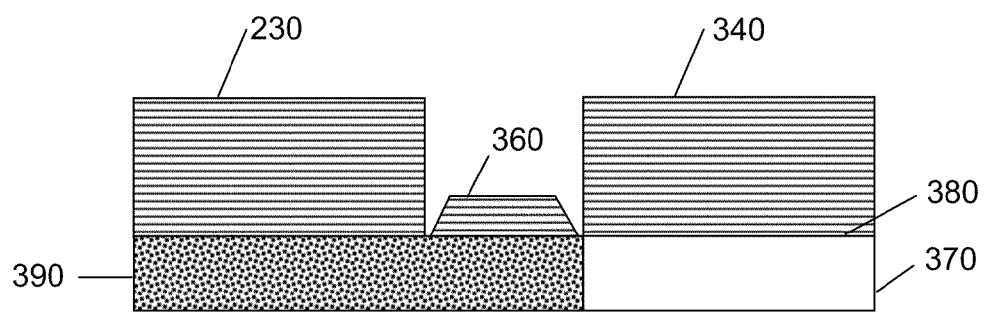

Referring to FIG. 28A, the area 360 of the semiconductor layer 230 surrounding semiconductor die 340 is partially removed using a photoelectrochemical etching process. In FIG. 28B, which is a view of Section A-A of FIG. 28A, due to the negative crowning effect, the edges of area 360 are etched at a faster rate, resulting in the regions adjacent to semiconductor die 340 and the surrounding InGaN semiconductor film 230 being removed while the central region of area 360 remains. FIG. 28C shows a close up of Detail B of FIG. 28A.

The mesas 380 may optionally be chemically treated or coated with an adhesive layer such that the semiconductor die 340 are weakly bonded to the mesas 380, wherein the adhesive force is sufficient to bond said semiconductor die to said mesas during the photoelectrochemical etching process but weak enough that the semiconductor die may be removed with a transfer tool. Such an optional adhesive layer on the mesas 380 may be a wax or other polymeric material with a sufficiently low melting point that the wax is liquefied when semiconductor die 340 is contacted by a heated transfer tool or simultaneously melted by infrared radiation projected onto the wax through substrate 370, wherein said infrared radiation is generated by for example an infrared diode laser.

Alternately, the regions 360 may be incompletely etched such that the remaining material is sufficient to bond the semiconductor die 340 to the mesas 380 during the photoelectrochemical etching process but weak enough that the semiconductor die may be removed with a transfer tool by fracturing the regions 360 adjacent to semiconductor die 340.

Figure 29:
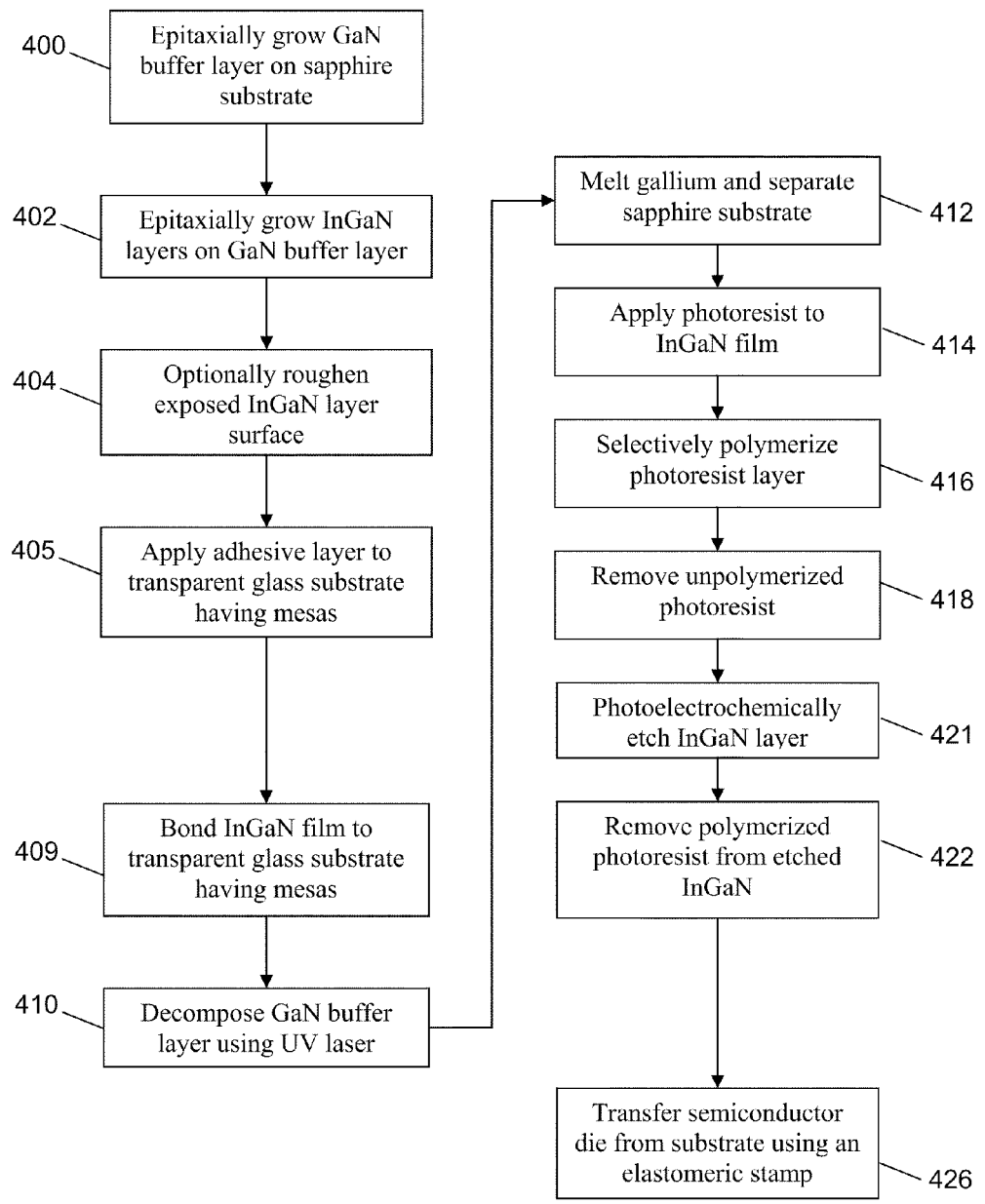
FIG. 29 depicts a flowchart of another method of the present invention for forming the semiconductor die as shown in FIGS. 28A-C.

A flowchart of the above method is presented in FIG. 29. Step 400 is to epitaxially grow a GaN buffer layer on a sapphire substrate. Then, in 402, InGaN layers are epitaxially grown on the GaN buffer layer. Optionally, in step 404, the exposed surface of the InGaN layer can be roughened to increase light output. An adhesive layer is applied to a transparent glass substrate with mesas in step 405.

Step 409 is to bond the InGaN film to the transparent glass substrate with mesas, using the adhesive. In step 410, the GaN buffer layer is decomposed using a UV laser. Heating of the assembly then occurs 412 to melt the gallium and allow for removal of the sapphire substrate from the assembly. Photoresist is then applied 414 to InGaN film, selectively polymerized 416, followed by removal 418 of the unpolymerized photoresist.

The next step 421 is to photoelectrochemically etch the InGaN layer using the negative crown effect to form semiconductor die. Polymerized photoresist is then removed 422 from the etched InGaN. Pin registration may be more appropriate for alignment in this embodiment than machine vision.

Finally, the semiconductor die are transferred 426 from the transparent intermediate substrate using an elastomeric stamp.

In the description herein, embodiments disclosing specific details have been set forth in order to provide a thorough understanding of the invention, and not to provide limitation thereof. However, it will be clear to one having skill in the art that other embodiments according to the present teachings are possible that are within the scope of the invention disclosed. Also, certain steps in the methods may not depend on all of the preceding steps being performed earlier in the method.

What is claimed is:

1. A method of manufacturing a transferable element, comprising the steps of:
providing a host substrate of a material exhibiting optical transparency;
forming an epitaxial layer on said host substrate including a layer allowing for radiation lift off;
defining one or more semiconductor dies in said epitaxial layer;
adhering a target substrate to one or more of said semiconductor dies, the adhering step comprising (i) bringing the target substrate into close proximity with the one or more semiconductor dies, (ii) creating contact between the target substrate and selected ones of the semiconductor dies, and (iii) bonding the selected semiconductor dies to the target substrate;

irradiating said radiation lift off layer to weaken the layer; and moving said host substrate and said target substrate apart, thereby transferring said one or more semiconductor dies from said host substrate to said target substrate, wherein bonding the selected semiconductor dies occurs concurrently with the irradiating of the radiation lift off layer.

2. The method of claim 1 wherein said bonding is by one of melting and solidifying solder or curing adhesive between the selected semiconductor dies and the target substrate.

3. The method of claim 1 wherein mesas are provided on the target substrate that receive the selected semiconductor dies.

4. A method of manufacturing a transferable element, comprising the steps of:

providing a host substrate of a material exhibiting optical transparency;

forming an epitaxial layer on said host substrate including a layer allowing for radiation lift off;

adhering an intermediate substrate to said epitaxial layer using selectively polymerized and unpolymerized adhesive;

irradiating said radiation lift off layer to weaken the layer;

removing the host substrate;

defining one or more semiconductor dies in said epitaxial layer;

removing unpolymerized adhesive;

adhering a transfer device to one or more of said semiconductor dies; and moving said transfer device and said intermediate substrate apart, thereby transferring said one or more semiconductor dies from said intermediate substrate to said transfer device.

5. The method of claim 4 wherein said forming step includes growing a buffer layer on a host substrate followed by growing the epitaxial layer on the buffer layer.

6. The method of claim 5 wherein said forming step also includes roughening an exposed surface of the epitaxial layer.

7. The method of claim 5 wherein said adhering step includes applying a layer of polymerizable adhesive to the intermediate substrate followed by selectively polymerizing the adhesive to bond the epitaxial layer to the intermediate substrate.

8. The method of claim 7 wherein said irradiating step includes decomposing the buffer layer.

9. The method of claim 8 wherein said defining step includes applying a polymerizable photoresist layer to the epitaxial layer.

10. The method of claim 9 wherein said defining step also includes etching the photoresist layer to form the semiconductor dies.

* * * * *